(12) United States Patent
Matsushita

(10) Patent No.: US 7,888,848 B2
(45) Date of Patent: Feb. 15, 2011

(54) PIEZOELECTRIC SINGLE CRYSTAL DEVICE AND FABRICATION METHOD THEREOF

(75) Inventor: Mitsuyoshi Matsushita, Chiba (JP)

(73) Assignee: JFE Mineral Company, Ltd., Tokyo (JP)

( * ) Notice: Subject to any disclaimer, the term of this patent is extended or adjusted under 35 U.S.C. 154(b) by 466 days.

(21) Appl. No.: 11/578,953

(22) PCT Filed: Oct. 29, 2004

(86) PCT No.: PCT/JP2004/016473

§ 371 (c)(1),
(2), (4) Date: Feb. 27, 2009

(87) PCT Pub. No.: WO2005/109537

PCT Pub. Date: Nov. 17, 2005

(65) Prior Publication Data

US 2009/0212667 A1  Aug. 27, 2009

(30) Foreign Application Priority Data

May 6, 2004 (JP) ............................ 2004-137300

(51) Int. Cl.
H01L 41/187 (2006.01)
H01L 41/22 (2006.01)
C04B 35/00 (2006.01)

(52) U.S. Cl. ................. 310/358; 252/62.9 PZ; 501/134; 29/25.35

(58) Field of Classification Search ................. 310/358; 252/62.9 PZ; 501/134; 29/25.35
See application file for complete search history.

(56) References Cited

U.S. PATENT DOCUMENTS

2002/0153809 A1  10/2002  Chen et al.

2003/0178914 A1  9/2003  Ogawa et al.

FOREIGN PATENT DOCUMENTS

EP  1744378 A1 *  1/2007

(Continued)

OTHER PUBLICATIONS

May 3, 2010 Supplementary European Search Report issued in European Patent Application No. 04 79 3393.

(Continued)

*Primary Examiner*—Thomas M Dougherty
(74) *Attorney, Agent, or Firm*—Oliff & Berridge, PLC

(57) ABSTRACT

The present invention provides a piezoelectric single crystal device excellent in heat resistance and capable of stably maintaining the electromechanical coupling factor $k_{31}$ in a lateral vibration mode at a high value of 50% or more without a decrease even in an operating environment in which the temperature changes from room temperature to a high temperature (specifically, 150° C.), and also provides a fabrication method thereof. Specifically, assuming that the [101] axis of a tetragonal system having the [001] axis as a C axis (with the largest lattice constant) is a polarization direction 3, a normal direction 1 to an edge face T of the piezoelectric device is within the solid-angle range of ±25° with respect to the [-101] axis substantially orthogonal to the polarization direction 3, the range including the [-101] axis. Assuming that the [011] axis of the tetragonal system is the polarization direction 3, the normal direction 1 to the edge face T of the piezoelectric device is within the solid-angle range of ±25° with respect to the [0-11] axis substantially orthogonal to the polarization direction 3, the range including the [0-11] axis. In any case, the electromechanical coupling factor $k_{31}$ in the direction orthogonal to the polarization direction 3, i.e., in the lateral vibration mode, is 50% or more.

30 Claims, 10 Drawing Sheets

FOREIGN PATENT DOCUMENTS

| | | | | |
|---|---|---|---|---|
| EP | | 1755177 A1 | * | 2/2007 |
| JP | A | 10-093154 | | 4/1998 |
| JP | A | 11-171644 | | 6/1999 |
| JP | A | 2001-080995 | | 3/2001 |
| JP | A | 2001-148522 | | 5/2001 |
| JP | A | 2003-282986 | | 10/2003 |
| JP | | 2005-317831 | * | 11/2005 |
| WO | WO-2005/109537 A1 | | * | 11/2005 |

OTHER PUBLICATIONS

R. Zhang et al., "Elastic, Piezoelectric, and Dielectric Properties of Multidomain $0.67Pb(Mg_{1/3}Nb_{2/3})O_3$-$0.33PbTiO_3$ Single Crystals", Journal of Applied Physics, vol. 90, No. 7, Oct. 2001, pp. 3471-3475.

T. Ogawa et al., "Poling Field Dependence of Ferroelectric Properties in $Pb(Zn_{1/3}Nb_{2/3})_{0.91}Ti_{0.09}O_3$ Single Crystal", Program Summary and Extended Abstracts of the $10^{th}$ US-Japan Seminar on Dielectric and Piezoelectric Ceramics, Sep. 2005, pp. 245-248.

* cited by examiner

ELECTRODE
FACE

↔
VIBRATION
DIRECTION

US 7,888,848 B2

PIEZOELECTRIC SINGLE CRYSTAL DEVICE AND FABRICATION METHOD THEREOF

TECHNICAL FIELD

The present invention relates to a piezoelectric single crystal device and a fabrication method thereof. More specifically, the invention relates to a piezoelectric single crystal device excellent in heat resistance and capable of stably maintaining the electromechanical coupling factor $k_{31}$ in a lateral vibration mode in a direction substantially orthogonal to a polarization direction at a high value of 50% or more without a decrease even in a high-temperature (specifically, 150° C.) operating environment, the device being composed of a piezoelectric single crystal device material with a tetragonal-system complex perovskite structure, which is a solid solution (referred to as "PMN-PT" or PMNT") represented by $Pb[(Mg, Nb)_{1-X}Ti_X]O_3$ containing lead magnesium niobate $Pb(Mg, Nb)O_3$ and lead titanate $PbTiO_3$. The invention also relates to a fabrication method of the piezoelectric single crystal device.

BACKGROUND ART

For example, as shown in FIG. 1, with a rectangular plate (a/b≧2.5, a>>L, b>>L) having an aspect ratio (a/b) of 2.5 or more, the electromechanical coupling factor $k_{31}$ in the lateral vibration mode is proportional to the square root of the conversion efficiency of electric energy or mechanical energy for the magnitude of vibration (lateral vibration) in a direction 1 orthogonal to a polarization direction 3 at the time of applying a voltage in the polarization direction 3. The higher this value, the more the efficiency improves. It should be noted that the shape of a piezoelectric single crystal device may be a square shape, a disc shape, a rod shape, or the like, instead of the above-described rectangular plate shape, and the electromechanical coupling factor $k_{31}$ can be determined in the same way with any one of these shapes.

In general, lead zircon titanate $Pb(Zr, Ti)O_3$ (PZT) disclosed in T. Ogawa, M. Matsushita, Y. Tachi, and K. Echizenya, "Program Summary and Extended Abstracts of the 10th US-Japan Seminar on Dielectric and Piezoelectric Ceramics" (September 26-29, (2001), pp. 245-248) is widely used as a material for forming the piezoelectric device. However, lead zircon titanate (PZT) described in the document of Ogawa et al has an electromechanical coupling factor $k_{31}$ of about 30%.

In order to obtain higher $k_{31}$ than that of the above-described PZT, for example, Japanese Unexamined Patent Application Publication No. 11-171644 discloses a piezoelectric ceramic composition containing $x(Pb_2Me_2O_7)\frac{1}{2}\cdot(1-x)[Pb(Zr_{1-y}Ti_y)O_3]$ as a main component and Cr and Si secondary components. However, the piezoelectric ceramic composition disclosed in Japanese Unexamined Patent Application Publication No. 11-171644 has an electromechanical coupling factor $k_{31}$ of 40% or less.

Furthermore, Jpn. J. Appl. Phys. 90 (2001) (pp. 3471-3475) discloses the measured piezoelectric properties of a single crystal of $0.67Pb(Mg_{1/3}Nb_{2/3})O_3\text{-}0.33PbTiO_3$ having an electromechanical coupling factor $k_{31}$ of as high as 59% (0.59), such as lateral mode $k_{31}$ in the [100] or [010] direction orthogonal to the [001] direction as the polarization direction.

However, Jpn. J. Appl. Phys. 90 (2001) (pp. 3471-3475) discloses the electromechanical coupling factor $k_{31}$ measured at room temperature, but the electromechanical coupling factor $k_{31}$ in use in a high-temperature (specifically 150° C.) environment is not disclosed. For example, in use as a piezoelectric device, the piezoelectric device may be soldered or bonded to a resin and thus used in an environment in which the temperature changes from room temperature to a high temperature (specifically 150° C.). In this case, the piezoelectric device tends to be decreased in electromechanical coupling factor $k_{31}$ due to deterioration. This point is not disclosed or suggested in Jpn. J. Appl. Phys. 90 (2001) (pp. 3471-3475).

DISCLOSURE OF INVENTION

An object of the present invention is to provide a piezoelectric single crystal device excellent in heat resistance and capable of stably maintaining the electromechanical coupling factor $k_{31}$ at a high value of 50% or more without a decrease even in an operating environment in which the temperature changes from room temperature to a high temperature (specifically 150° C.), the device being composed of a piezoelectric single crystal device material having a tetragonal-system complex perovskite structure, which is a solid solution (referred to as "PMN-PT" or PMNT") represented by $Pb[(Mg, Nb)_{1-X}Ti_X]O_3$ containing lead magnesium niobate and lead titanate, and also provide a fabrication method of the piezoelectric single crystal device.

In order to achieve the object, the gist of the present invention is as follows:

(1) A piezoelectric single crystal device, with a polarization direction along a [101] axis of a tetragonal system which has a [001] axis as a C axis (with the largest lattice constant), has a normal direction to an edge face thereof within the solid-angle range of ±25° with respect to a [-101] axis which is substantially orthogonal to the polarization direction, the range including the [-101] axis, and yields an electromechanical coupling factor $k_{31}$ of 50% or more in a lateral vibration mode in a direction substantially orthogonal to the polarization direction.

(2) A piezoelectric single crystal device, with a polarization direction along a [011] axis of a tetragonal system which has a [001] axis as a C axis (with the largest lattice constant), has a normal direction to an edge face thereof within the solid-angle range of ±25° with respect to a [0-11] axis which is substantially orthogonal to the polarization direction, the range including the [0-11] axis, and yields an electromechanical coupling factor $k_{31}$ of 50% or more in a lateral vibration mode in a direction substantially orthogonal to the polarization direction.

(3) The piezoelectric single crystal device described above in (1) or (2) is composed of a single crystal device material which is a solid solution of $Pb[(Mg, Nb)_{1-X}Ti_X]O_3$ (wherein X is a molar fraction of Ti relative to the total molar fraction of 1 of Mg, Nb, and Ti), X satisfying the relation $0.30<X<0.40$ and the material having a complex perovskite structure.

The tetragonal system has a parallelepiped unit lattice having a crystal structure in which the [100] axis (a axis) and the [010] axis (b axis) having equal lengths are orthogonal to the [001] axis (c axis) having the largest lattice constant. When the molar fraction of lead titanate (PT) in the solid solution described above in (3) is close to 0.30, the structure includes a portion showing a pseudocubic system which is thermodynamically a low-temperature phase.

The perovskite structure means a structure ($RMO_3$) of a unit lattice of a solid solution single crystal in which R ions are positioned at the corners of the unit lattice, oxygen ions are positioned at the face centers of the unit lattice, and a M ion is positioned at the body center of the unit lattice, as schematically shown in FIG. 2. The complex perovskite structure according to the present invention means that any one of two or more types of M ions, not a single element ion, is positioned at the body center shown in FIG. 2.

(4) The piezoelectric single crystal device described above in (1) to (3) further contains 0.05 mol % to 30 mol % of In in the solid solution.

(5) A method for fabricating the piezoelectric single crystal device described in any one of (1) to (4) includes primary polarization processing for polarizing a single crystal ingot, a cut out single crystal block, or a cut out single crystal device by applying an electric field under predetermined conditions in the polarization direction along a [101] or [011] direction before or after processing for cutting out a single crystal device material in a predetermined shape from the single crystal ingot in a predetermined direction.

(6) The method for fabricating the piezoelectric single crystal device described above in (5) includes primary polarization processing for polarizing the single crystal ingot or the single crystal block by applying an electric field in the [101] or [011] direction under predetermined conditions, and processing for cutting out a single crystal device of a predetermined shape in a predetermined direction from the single crystal ingot or the single crystal block.

(7) In the method for fabricating the piezoelectric single crystal device described above in (5) or (6), the primary polarization processing includes applying a DC electric field of 350 to 1500 V/mm in the temperature range of 20° C. to 200° C. in the [101] or [011] direction of the single crystal ingot or the single crystal block or cooling the single crystal ingot or the single crystal block to room temperature while applying a DC electric field of 250 to 500 V/mm at a temperature higher than the Curie temperature (Tc) thereof.

(8) The method for fabricating the piezoelectric single crystal device described above in (5) includes processing for cutting out a single crystal device of a predetermined shape in a predetermined direction from the single crystal ingot, and primary polarization processing for polarizing the single crystal device by applying an electric field in the [101] or [011] direction under predetermined conditions.

(9) In the method for fabricating the piezoelectric single crystal device described above in (5) or (8), the primary polarization processing includes applying a DC electric field of 350 to 1500 V/mm in the temperature range of 20° C. to 200° C. in the [101] or [011] direction of the cut out single crystal device or cooling the single crystal device to room temperature while applying a DC electric field of 250 to 500 V/mm at a temperature higher than the Curie temperature (Tc) thereof.

(10) The method for fabricating the piezoelectric single crystal device described above in (5) to (9) further includes auxiliary polarization processing for polarizing by applying an electric field in a direction orthogonal to the polarization direction before or after the primary polarization processing.

Examples of the electric field applied in the direction 1 orthogonal to the polarization direction 3 include steady-state electric fields such as DC electric fields, pulse electric fields, and AC electric fields; and attenuation electric fields. The conditions such as the strength, application time, temperature, and the like of the electric field are appropriately controlled according to the properties of each piezoelectric crystal device and the desired value of the electromechanical coupling factor $k_{31}$ in the direction 1 orthogonal to the polarization direction 3. These conditions can be determined by an experiment or the like. As the pulse electric field, unipolar and bipolar pulses such as a square wave and an AC triangular wave can be used.

The present invention is capable of fabricating the piezoelectric single crystal device used for applications positively using the electromechanical coupling factor $k_{31}$ in the direction 1 (lateral vibration mode) orthogonal to the polarization direction 3, for example, an accurate positioning actuator for a magnetic head, a piezoelectric gyro device, an image stabilizer for a digital still camera, a cardiac pacemaker sensor, and the like. In particular, the piezoelectric single crystal device of the present invention can stably maintain the electromechanical coupling factor $k_{31}$ in the lateral vibration mode at a high value of 50% or more without a reduction even in an operating environment in which the temperature changes from room temperature to a high temperature (specifically 150° C.).

Figure 1:
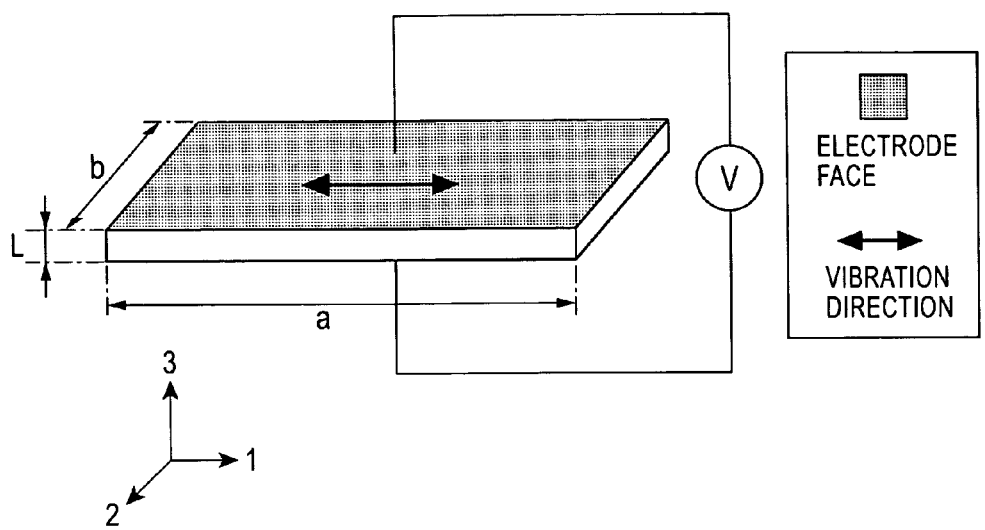
FIG. 1 is a perspective view showing the orientation and shape of a piezoelectric single crystal device in a polarization state according to the present invention.

| (Reference Numerals) | |
|---|---|
| 10 | piezoelectric single crystal device |
| 10a | top face (or electrode face) of piezoelectric single crystal device |
| 10b | bottom face (or electrode face) of piezoelectric single crystal device |
| 10c or T | edge face of piezoelectric single crystal device using a lateral vibration mode |
| 11 | single crystal wafer |
| 10A | piezoelectric single crystal device with [101] direction as polarization direction |
| 10B | piezoelectric single crystal device with [011] direction as polarization direction |
| a | dimension in lateral direction (lateral vibration direction 1) of piezoelectric single crystal device |
| b | dimension of edge face (depth direction 2) of piezoelectric single crystal device |
| b' | convex edge face of piezoelectric single crystal device |
| b" | concave edge face of piezoelectric single crystal device |
| L | dimension in longitudinal direction (polarization direction 3) of piezoelectric single crystal device |
| V | DC voltage |
| 1 | normal direction (lateral vibration direction) to edge face of piezoelectric single crystal device |
| 3 | polarization direction (longitudinal vibration direction) |

BEST MODE FOR CARRYING OUT THE INVENTION

The reasons for restricting a piezoelectric single crystal device of the present invention will be described below.

Figure 5:
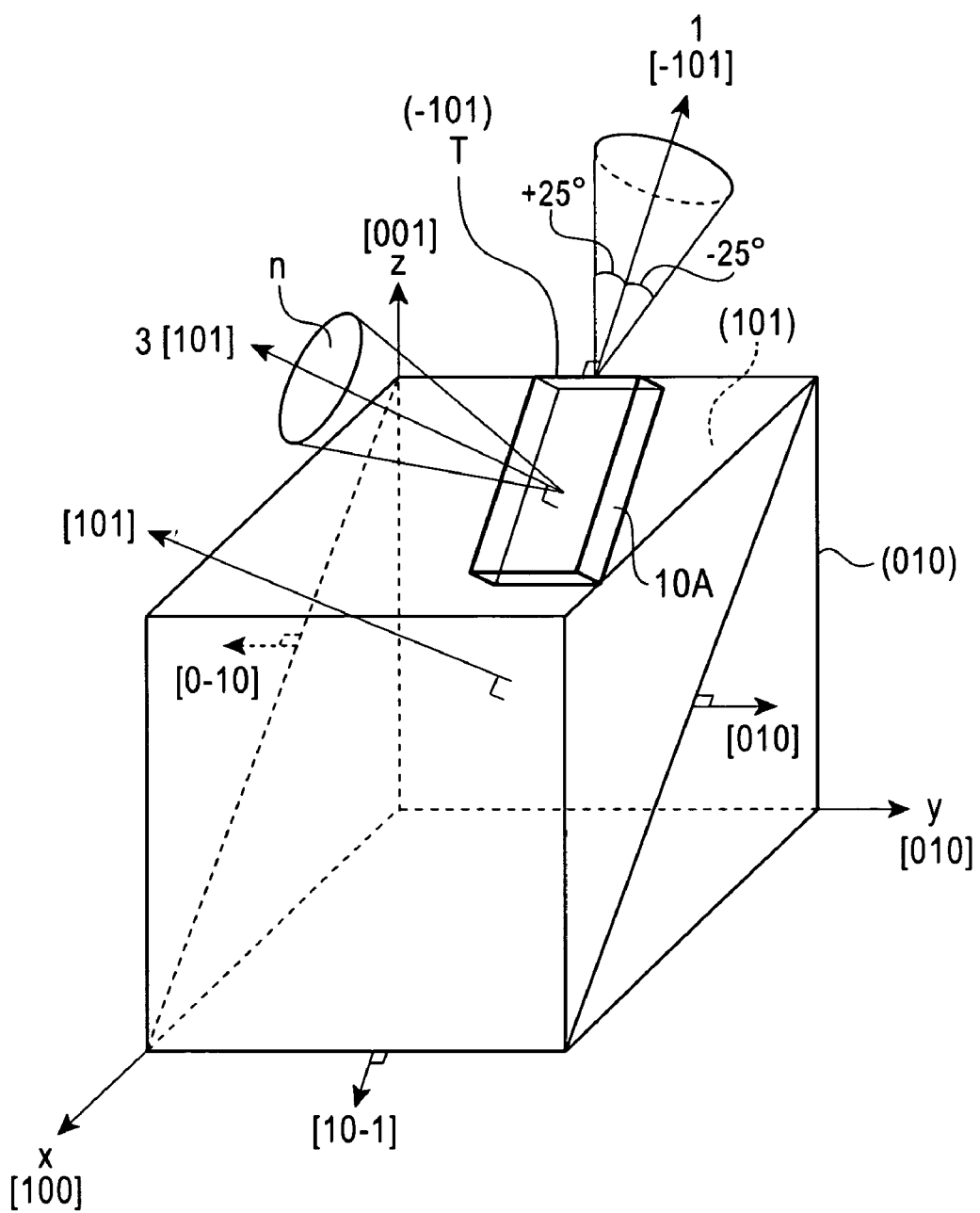
FIG. 5 is a perspective view showing, in a three-axis orthogonal coordinate system, a piezoelectric single crystal device 10A cut out with the (101) face as a wafer face (the widest face).
Figure 6:
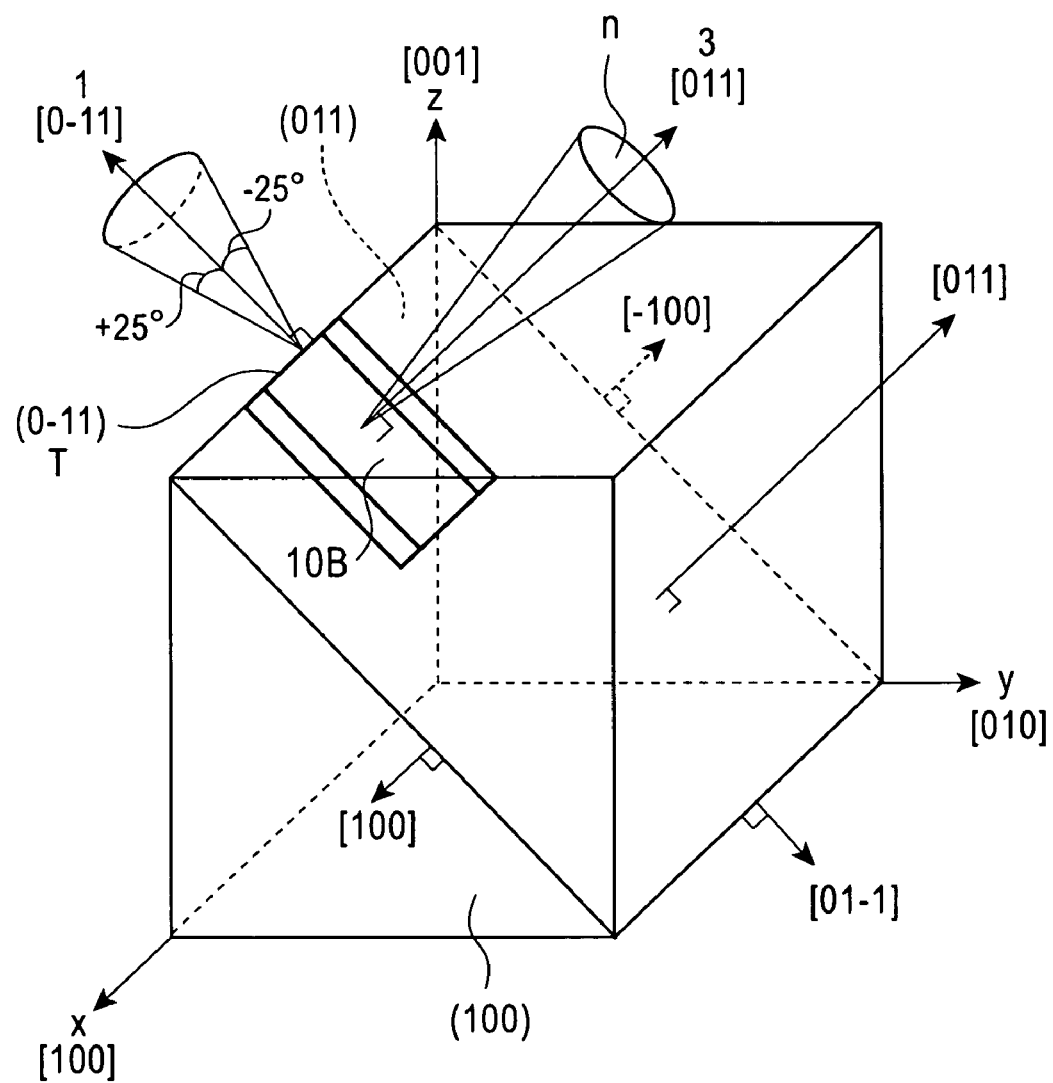
FIG. 6 is a perspective view showing, in a three-axis orthogonal coordinate system, a piezoelectric single crystal device 10B cut out with the (011) face as a wafer face (the widest face).

(1) Relation Between Polarization Direction and Normal Direction to Piezoelectric Device Edge Face:

As shown in FIG. 5, assuming that the [101] axis of a tetragonal system having the [001] axis as a C axis (with the largest lattice constant) is a polarization direction, the normal direction 1 to the edge face T of a piezoelectric single crystal device 10A is preferably within a conical solid-angle range of ±25° with respect to the [-101] axis substantially orthogonal to the polarization direction [101], the range including the [-101] axis. Alternatively, as shown in FIG. 6, assuming that the [011] axis of a tetragonal system having the [001] axis is the polarization direction, the normal direction 1 to the edge face T of the piezoelectric single crystal device 10A is preferably within a conical solid-angle range of ±25° with respect to the [0-11] axis substantially orthogonal to the polarization direction [011], the range including the [0-11] axis. As shown in FIGS. 5 and 6, the normal direction n to the widest face of the piezoelectric single crystal device is within the conical solid-angle range of 0°±25° on the assumption that the polarization direction [101] or [011] is 0°.

The conceivable reason for restricting the normal direction 1 to the edge face T of the piezoelectric single crystal device using a lateral vibration mode within this angle range is as follows: Within the specified solid-angle range, lateral vibration in the [-101] axial direction or lateral vibration in the [0-11] axial direction does not disperse in other axial directions, and thus energy in the lateral vibration mode in the axial direction is maintained without being decreased, resulting in a high electromechanical coupling factor $k_{31}$ of 50% or more. On the other hand, when the normal direction 1 to the edge face T of the piezoelectric single crystal device is out of the specified solid-angle range, in the former piezoelectric single crystal device 10A, lateral vibration is dispersed by the influence of the [-111] or [-1-11] axis at an angle of about 350 with the [-101] axial direction. In the latter piezoelectric single crystal device 10B, lateral vibration is dispersed by the influence of the [1-11] or [-1-11] axis at an angle of about 35° with the [0-11] axial direction. This means that energy in the lateral vibration mode in the [-101] or [0-11] direction is decreased. As a result, an electromechanical coupling factor $k_{31}$ of 50% or more in the lateral vibration mode cannot be obtained. The piezoelectric single crystal device 10A shown in FIG. 5 and the piezoelectric single crystal device 10B shown in FIG. 6 are equivalent in view of the symmetry of the tetragonal system.

(2) Crystal Structure of Piezoelectric Single Crystal Device (Tetragonal Complex Perovskite Structure):

The crystal structure of the present invention is a tetragonal structure. The tetragonal structure has a parallelepiped unit lattice having a crystal structure in which the [100] axis (a axis) and the [010] axis (b axis) with equal lengths are orthogonal to the [001] axis (c axis) with the largest lattice constant. However, when the molar fraction of lead titanate (PT) in the solid solution of $Pb[(Mg, Nb)_{1-X}Ti_X]O_3$ described above in (3) is close to 0.30, the structure includes a portion of a pseudocubic system which is thermodynamically a low-temperature phase.

Figure 2:
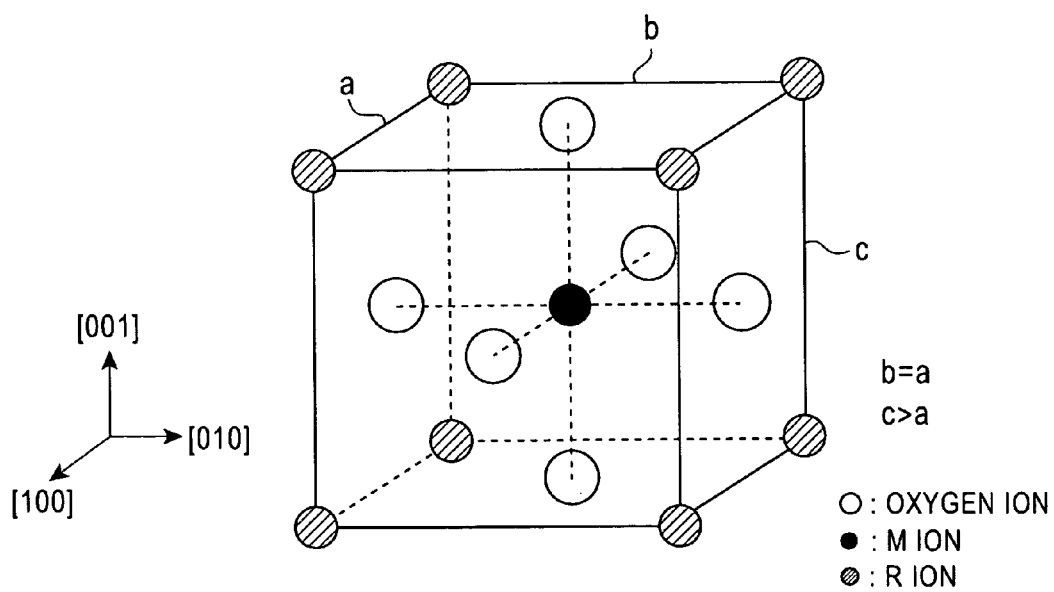
FIG. 2 is a schematic perspective view of a perovskite crystal structure ($RMO_3$).

The crystal structure of the present invention is a complex perovskite structure ($RMO_3$) in which in the unit lattice shown in FIG. 2, Pb ions are positioned at the corners of the unit lattice, oxygen ions are positioned at the face centers of the unit lattice, and a M ion of Mg, Nb, In, or Ti is positioned at the body center of the unit lattice.

(3) Composition of Single Crystal Device

Figure 4:
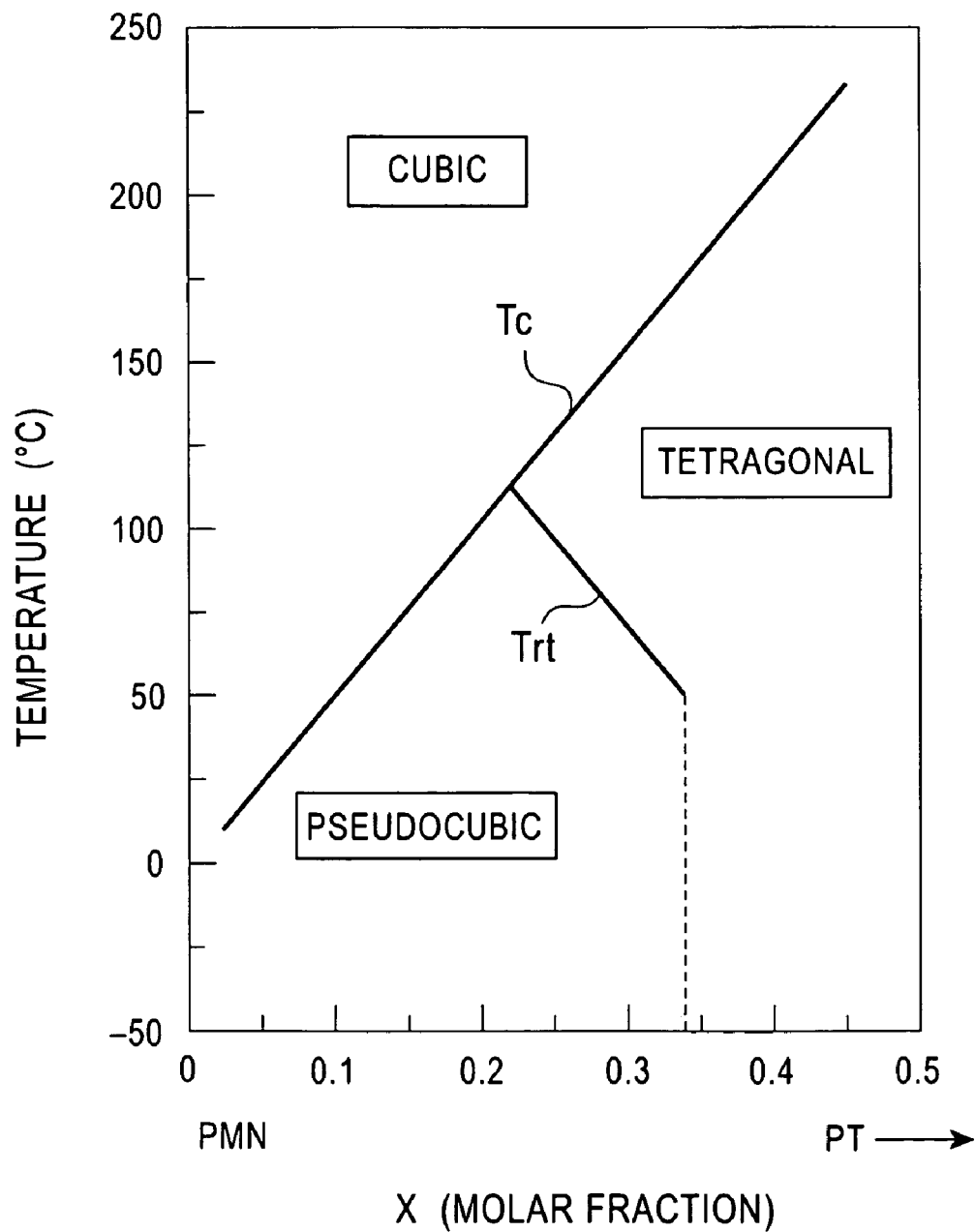
FIG. 4 is a phase diagram of PMN-PT (PMNT).

The composition of the single crystal device of the present invention is composed of the solid solution of, for example, $Pb[(Mg, Nb)_{1-X}Ti_X]O_3$ (wherein X is the molar fraction of Ti relative to the total molar fraction of 1 of Mg, Nb, and Ti) in which X satisfies 0.30<X<0.40, and has the complex perovskite structure. It is more preferably that 0.34<X<0.38. When the molar fraction X is 0.3 or less, as shown in FIG. 4, the solid-solution device is mainly occupied by a pseudocubic system. In addition, when the device is used in a temperature range from room temperature to a high temperature (e.g., 150° C.), phase transition easily occurs between the tetragonal system and the pseudocubic system because the phase transition temperature $T_{rt}$ is a relatively low temperature higher than room temperature. As a result, the performance of the tetragonal piezoelectric device may be degraded to decrease the electromechanical coupling factor $k_{31}$. When the molar fraction X is 0.40 or more, the phase transition temperature between the pseudocubic system and the tetragonal system is lower than room temperature, and thus phase transition does not occur in the range of room temperature to 150° C. However, the molar fraction of lead titanate is excessively high, and thus the piezoelectric properties of the solid solution tend to deteriorate, thereby failing to obtain an electromechanical coupling factor $k_{31}$ or 50% or more in the lateral vibration mode.

When the molar ratio Mg/Nb of Mg to Nb in lead magnesium niobate $Pb(Mg, Nb)O_3$ is in a range of 0.45 to 0.54, the complex perovskite structure is maintained. Therefore, this range is included in the present invention.

For the piezoelectric device of the present invention, lead indium magnesium niobate-lead titanate (PIMN-PT) containing lead magnesium niobate-lead titanate (PMN-PT) and further containing In, preferably 0.05 mol % to 30 mol % of In, can be used. Since the ionic radius of indium (In) is larger than that of magnesium (Mg) but is smaller than that of niobium (Nb), lattice strain due to a difference in ionic radium between niobium (Nb) and magnesium (Mg), each of which is positioned at the body center of the unit lattice of the perovskite structure, is reduced, thereby causing the function to prevent the occurrence of cracks in single crystal growth and chipping in piezoelectric device processing. In the present invention, therefore, the adding amount of indium necessary for exhibiting the function is 0.05 mol % or more, but the addition of over 30 mol % is undesirable because the melting point of a raw material in single crystal growth is increased to cause difficulty in processing control in fabrication.

In the case of the need to increase the specific inductive capacity $\in_r$, 0.5 mol ppm to 5 mol % of at least one element of Sb, La, W, and Ta may be further added to the composition of the piezoelectric single crystal device. In the case of the need to increase the mechanical quality factor Qm, 0.5 ppm to 5 mol % of at least one of Mn and Cr may be further added to the composition of the piezoelectric single crystal device.

Furthermore, Al and Li contribute to stabilization in single crystal growth. In order to obtain the effect, at least one of Al and Li is preferably added in a total of 0.05 mol % or more.

These atoms (Sb, La, W, Ta, Mn, Cr, Al, Li) are positioned at the body centers of the unit lattices or positioned between the lattices. The addition of the atoms in a total of over 5 mol % may cause difficulty in obtaining a single crystal, and thus a polycrystal may be produced.

When calcium oxide is added to a raw material, calcium (Ca) of calcium oxide is positioned as substitutional atoms at some of the lead (Pb) sites (R ions in FIG. 2) in a crystal lattice composed of a solid solution of lead-based perovskite structure compound (lead magnesium niobate, lead titanate, and lead indium niobate) and thus function to suppress the evaporation of lead oxide at a high temperature. The function of Ca suppresses the production of a pyrochlore phase, thereby facilitating the production of a single crystal of a desired complex perovskite phase. In the present invention, in order to exhibit the Ca function, it is necessary to substitute by calcium at a ratio of 0.05 mol % or more. However, substitution at a ratio of over 10 mol % causes difficulty in single crystal growth. Therefore, 0.05 mol % to 10 mol % of lead in the crystal lattice is preferably substituted by calcium, and 0.05 mol % to 5 mol % of lead is more preferably substituted by calcium.

In order to substitute 0.05 to 10 mol % of lead in the composition (crystal lattice) of a single crystal ingot by calcium, it is necessary to add calcium in view of the evaporation of calcium in single crystal growth. A method for adding calcium is not particularly limited. For example, calcium-substituted lead magnesium niobate, calcium-substituted lead zinc niobate, or calcium-substituted lead titanate may be used. Alternatively calcium oxide or calcium carbonate may be added to the raw material.

Impurities such as Fe, Pt, Au, Pd, and Rh may be mixed in from the raw material and crucible used in the process for producing the piezoelectric single crystal. However, these impurities inhibit the production of the single crystal and are preferably suppressed to a total of 0.5 mol % or less.

(4) Formation of Piezoelectric Single Crystal Device

Figure 3:
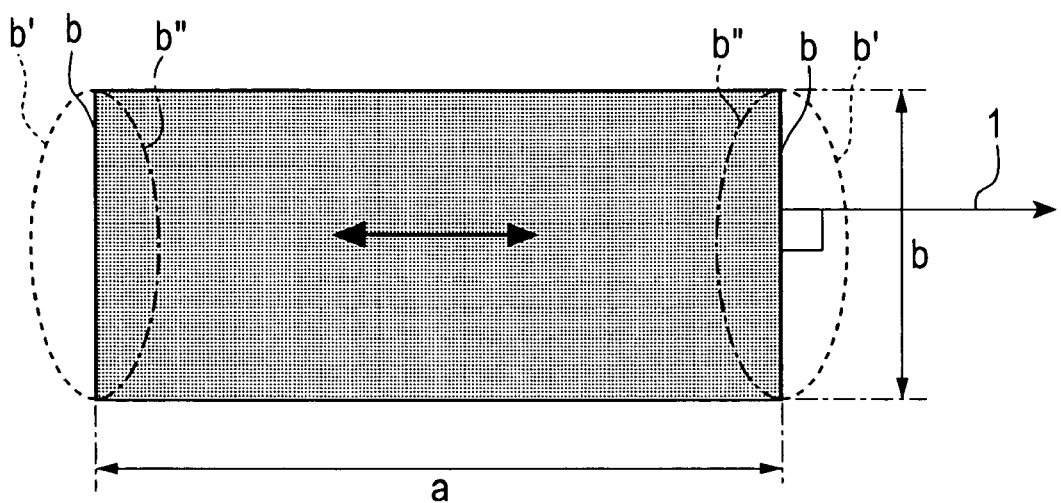
FIG. 3 is a drawing showing various shapes of the edge faces of a piezoelectric single crystal device using a lateral vibration mode according to the present invention.
Figure 3:
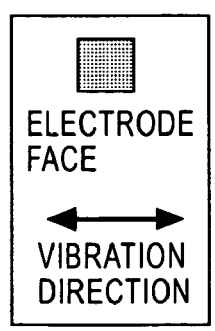

The shape of the intended piezoelectric single crystal device of the present invention is preferably such a rectangular plate as shown in FIG. 1 from the viewpoint that the electromechanical coupling factor $k_{31}$ in the direction 1 (lateral vibration mode) substantially orthogonal to the polarization direction 3 is effectively increased. In particular, the shape of the device is preferably a rectangular plate having an aspect ratio (a/b) of 2.5 or more (a/b≧2.5, a>>L, b>>L) and more preferably a rectangular plate having an aspect ratio (a/b) of 3 or more. The both edge faces (short sides b) of the rectangular plate of the present invention may be convexly curved b' (broken line) or concavely curved b" (one-dot chain line) according to applications, as shown in FIG. 3. The shape may be a square plate with a=b. In the present invention, the edge faces of the piezoelectric device are shown by the short sides b orthogonal to long sides a in a plan view of FIG. 3. Therefore, the normal direction 1 to the edge faces of the piezoelectric device is parallel to the long sides a of the piezoelectric device.

Next, a preferred method for fabricating the piezoelectric single crystal device of the present invention will be described.

A method for fabricating the piezoelectric single crystal device of the present invention includes primary polarization processing for polarizing a single crystal ingot or a single crystal block having a tetragonal structure by applying an electric field in a [101] or [011] direction thereof under predetermined conditions, and processing for cutting out the single crystal device in a predetermined shape from the single crystal ingot in a predetermined direction.

Another method for fabricating the piezoelectric single crystal device of the present invention includes processing for cutting out the single crystal device in a predetermined shape from a single crystal ingot with a tetragonal structure in a predetermined direction, and primary polarization processing for polarizing the single crystal device by applying an electric field in the [101] or [011] direction thereof under predetermined conditions.

The single crystal block is cut into a block shape from the single crystal ingot by a wire saw or the like. When the polarization processing is difficult in view of the shape of the single crystal ingot, the single crystal block easy to polarize is cut out and subjected to the polarization processing.

Now, description will be made of the reasons for restricting the fabricating method of the invention in each of the processings.

(1) Fabrication of Single Crystal Ingot:

A single crystal which is a solid solution composed of $Pb[(Mg, Nb)_{1-X}Ti_X]O_3$ (wherein X is the molar fraction of Ti relative to the total molar fraction of 1 of Mg, Nb, and Ti) in which X satisfies 0.30<X<0.40, a single crystal having the above-described composition and further containing 0.05 to 30 mol % of In and 0.5 mol ppm to 5 mol % of at least one of Mn, Cr, Sb, W, Al, La, Li, and Ta, or a single crystal having the above-described composition in which 0.05 to 10 mol % of lead is substituted by calcium is used. An ingot of the single crystal is produced by a method in which a raw material prepared to have the above composition is dissolved in a flux and then coagulated by decreasing the temperature, or a method in which the raw material is melted by heating to above the melting point and then coagulated in one direction. Examples of the former method include a solution Bridgemann method and TSSG method (Top Seeded Solution Growth). Examples of the latter method include a melt Bridgemann method and a CZ method (Czochralski method). In the present invention, the production method is not particularly limited.

(2) Determination of Crystallographic Orientation of Single Crystal Ingot:

The [101] axial orientation or [011] axial orientation of the single crystal ingot is approximately determined by a Laue method. At the same time, the [-101] axial orientation substantially orthogonal to the [101] axial orientation and the [010] axial orientation, or the [0-11] axial orientation substantially orthogonal to the [011] axial orientation and the [100] axial orientation are approximately determined. As shown in FIGS. 5 and 6, the [101] axis and the [011] axis are equivalent from the viewpoint of symmetry of a tetragonal crystal.

Furthermore, the crystallographic faces of the {110} and {100} faces orthogonal to any one of the above crystal axes are polished, and precise orientation is determined by a X-ray direction finder or the like to correct the offset of the polished faces.

(3) Rough Cutting (Preparation of Wafer or Block with Appropriate Thickness):

The single crystal ingot is cut with a cutting machine such as a wire saw or an inner diamond saw in parallel with or substantially orthogonally to the polished faces {110} and {100} to obtain a plate (wafer) or a block having an appropriate thickness. After cutting, chemical etching with an etching solution may be performed as necessary.

(4) Polishing (Preparation of Wafer with Appropriate Thickness):

The wafer is ground or polished with a lapping machine, a polishing machine, or a grinding machine to prepare the wafer with a predetermined thickness. It should be noted that after grinding or polishing, chemical etching with an etching solution may be performed as necessary.

(5) Fabrication of Single Crystal Device:

The wafer of the present invention has the (101) or (011) face as a wafer face (widest face). As shown in FIGS. 5 and 6, the (101) face and the (011) face are equivalent in view of symmetry of a tetragonal crystal. A single crystal device material with a predetermined shape is cut out from the wafer using a precise cutting machine such as a dicing saw or a cutting saw so that when the (101) face is the wafer face, the normal direction 1 to the edge face T of the piezoelectric device 10A is within a solid-angle range ±25° with respect to the [-101] axis, the range including the [-101] axis, while when the {011} face is the wafer face, the normal direction 1 to the edge face T of the piezoelectric device 10A is within a solid-angle range ±25° with respect to the [0-11] axis, the range including the [0-11] axis.

FIG. 5 shows, in a three-axis orthogonal coordinate system, the state of cutting out the single crystal such that the (101) face is the wafer face (widest face), and the normal direction 1 to the end face T of the piezoelectric device 10A using the lateral vibration mode is the [-101] direction. FIG. 6 shows, in a three-axis orthogonal coordinate system, the state of cutting out the single crystal such that the (011) face is the wafer face (widest face), and the normal direction 1 to the end face T of the piezoelectric device 10B using the lateral vibration mode is the [0-11] direction. The single crystal block may be directly cut out with the dimensions of the piezoelectric device using a precision cutting machine such as a dicing saw or a cutting saw.

(6) Formation of Electrode:

It is necessary to previously form electrodes required for applying an electric field in the primary polarization processing or the auxiliary polarization processing.

Before the primary polarization processing, a Cr—Au film (first Cr layer: about 50 nm in thickness, second Au layer: about 100 to 200 nm in thickness) is formed by sputtering on each of the top and bottom faces (the (101) and (-10-1) faces in FIG. 5 or the (011) and (0-1-1) faces in FIG. 6) of the prepared single crystal device material, a gold film is formed by plasma evaporation, or a silver film is formed by screen printing, followed by baking to form the electrodes.

Before the auxiliary polarization processing, the electrodes are formed on two opposing faces perpendicular to the auxiliary polarization direction by the same method as described above.

When the primary polarization processing is performed after the auxiliary polarization processing or when the auxiliary polarization processing is performed after the primary polarization processing, it is necessary to completely remove the residual electrodes using an appropriate chemical etching solution or acid because the residual electrodes used in the first polarization processing may destabilize the subsequent polarization processing.

(7) Primary Polarization Processing:

In the single crystal cut out from the single crystal ingot after growth, domains each composed of a group of electric dipoles in the same direction have different electric dipole directions in the polarization direction 3 and the direction orthogonal thereto. Therefore, the single crystal does not exhibit piezoelectric properties and are in an unpolarized state.

Hence, polarization is required. For the piezoelectric device with the composition of the present invention, it is preferable to apply a DC electric field of 350 to 1500 V/mm to the single crystal ingot, the cut out single crystal block, or the cut out single crystal device in the polarization direction 3 in the temperature range of 20° C. to 200° C. In other words, when the polarization temperature is less than 20° C. or the electric field is less than 350 V/mm, the polarization may be insufficient, while when the temperature exceeds 200° C. or the electric field exceeds 1500 V/mm, overpolarization may occur to deteriorate the piezoelectric properties of the piezoelectric single crystal device. Furthermore, distortion in the crystal may increase due to an excessive electric field, leading to cracks in the piezoelectric single crystal device.

The polarization time is preferably adjusted according to the polarization temperature and applied electric field selected in the above-described preferred ranges. The maximum polarization time is preferably 180 minutes.

Alternatively, it is preferable to decrease the temperature (electric field cooling) to room temperature while applying a DC electric field of 250 to 500 V/mm in the polarization direction 3 at a temperature higher than the Curie temperature Tc (e.g., the Tc line in FIG. 4) of the single crystal device, preferably 190° C. to 200° C. Temperature rising to above the Curie temperature Tc temporarily eliminates electric dipoles, and temperature lowering to below the Curie temperature with the electric field applied more uniformly aligns the directions of the electric dipoles. In the case of a temperature below the Curie temperature, the electric dipoles partially remain, thereby causing insufficient polarization. When the electric field is less than 250 V/mm, polarization may be insufficient, while when the electric field exceeds 500 V/mm, overpolarization may occur. The cooling rate is preferably determined so as not to cause cracks in the device during cooling.

Note that the Curie temperature Tc is a transition temperature above which a material exhibits neither piezoelectric properties nor ferroelectric properties since electric dipoles face in random directions and are not aligned. The Curie temperature is determined by the composition and structure of a material (refer to the Tc line in FIG. 4).

(8) Auxiliary Polarization Processing:

While the above-described primary polarization processing is performed for primary polarization of the piezoelectric single crystal device, the auxiliary polarization processing is performed for controlling the alignment state of a ferroelectric domain orthogonal to the polarization direction 3 by applying an electric field in the direction orthogonal to the polarization direction 3, preferably the lateral vibration direction 1, before or after the primary polarization processing.

Types of the electric field applied in the direction orthogonal to the polarization direction 3 include attenuation electric fields and steady-state electric fields such as DC electric fields, pulse electric fields, alternating current electric fields, and the like. The appropriate conditions of the electric field, such as strength, application time, temperature, and the like depend on the properties of each piezoelectric single crystal device and the desired electromechanical coupling factor $k_{31}$ in the direction orthogonal to the polarization direction. These conditions can be determined by experiments or the like. In order to obtain the advantage of the auxiliary polarization, the auxiliary polarization processing temperature is preferably 25° C. to a phase transition temperature (for example, the Trt line shown in FIG. 4), and the applied electric field range is preferably 350 to 1500 V/mm. It should be noted that the polarization time is preferably adjusted depending on the polarization temperature and applied electric field selected in the above-described preferable ranges, in particular, preferably 10 minutes to 2 hours.

Figure 7:
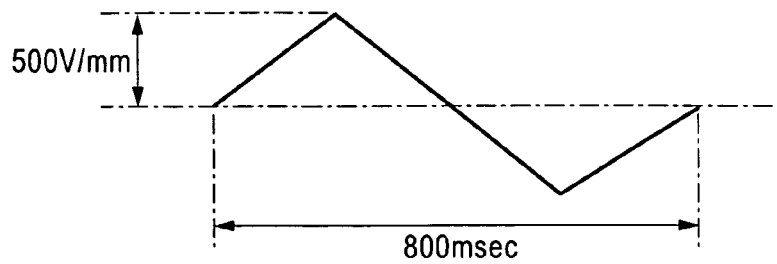
FIG. 7 is a waveform diagram of a bipolar triangular wave pulse.

Also, examples of the pulse electric field include unipolar and dipolar pulses, such as alternating current triangle waves and like, as shown in FIG. 7, in addition to orthogonal waves.

EXAMPLE 1

Figure 8A:
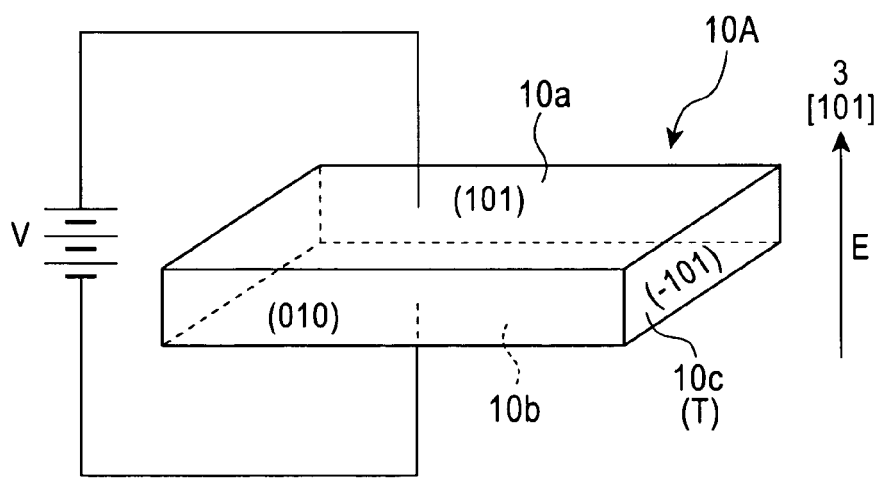
FIG. 8A is a diagram illustrating the application of a DC electric field to a piezoelectric single crystal device 10A.
Figure 8B:
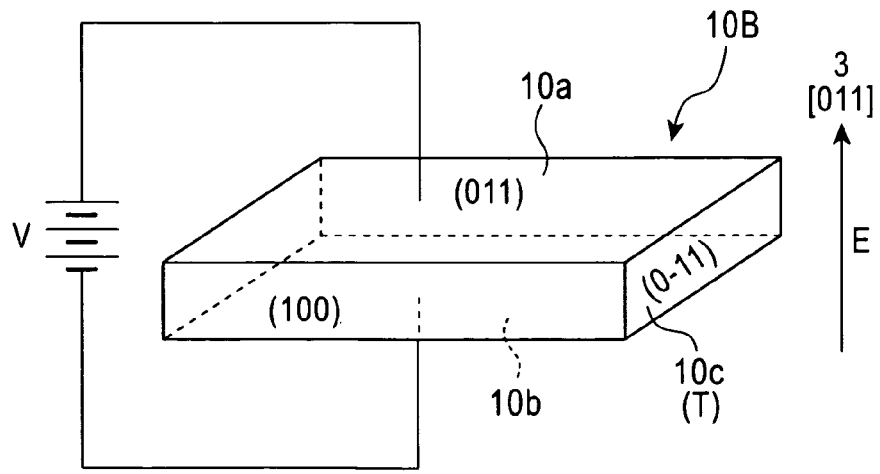
FIG. 8B is a diagram illustrating the application of a DC electric field to a piezoelectric single crystal device 10B.

The single crystal devices used in this example were the single crystal devices 10A and 10B each composed of lead magnesium niobate (PMN) and lead titanate (PT) (PMN-PT) (composition formula: Pb[(Mg, Nb)$_{1-X}$Ti$_X$]O$_3$ (X=0.36)). The shapes and the like (Curie temperature Tc=186° C., device size: 13 mm length×4 mm width×0.36 mm thickness) of the piezoelectric single crystal device 10A having the [101] direction as the polarization direction and the piezoelectric single crystal device 10B having the [011] direction as the polarization direction are shown in FIGS. 8A and 8B, respectively.

The piezoelectric single crystal devices 10A and 10B were fabricated as follows: A raw material was prepared to have the composition Pb[(Mg, Nb)$_{1-X}$Ti$_X$]O$_3$ (X=0.36), and then a single crystal ingot was produced by the aforementioned melt Bridgemann method. Next, the precise crystallographic orientation of the single crystal ingot was determined, and the single crystal ingot was polished and then cut with a wire saw in parallel with the polished faces, i.e., the (101) face and the (011) face, to obtain a plate of 0.5 mm in thickness. The plate was polished with a polishing machine to obtain a wafer of 0.36 mm in thickness. Then, a device size of 13 mm length×4 mm width×0.36 mm thickness was cut out from the wafer using a dicing saw.

In cutting out the device shape with a dicing saw, in the piezoelectric single crystal device 10A having the (101) face as the polished face, the [101] axis of the tetragonal system was in the polarization direction 3, while in the piezoelectric single crystal device 10B having the (011) face as the polished face, the [011] axis of the tetragonal system was in the polarization direction 3. In each of the piezoelectric single crystal devices 10A and 10B, the orientation (strictly, the normal direction 1 to the edge face T) of the edge face T was changed.

Figure 9A:
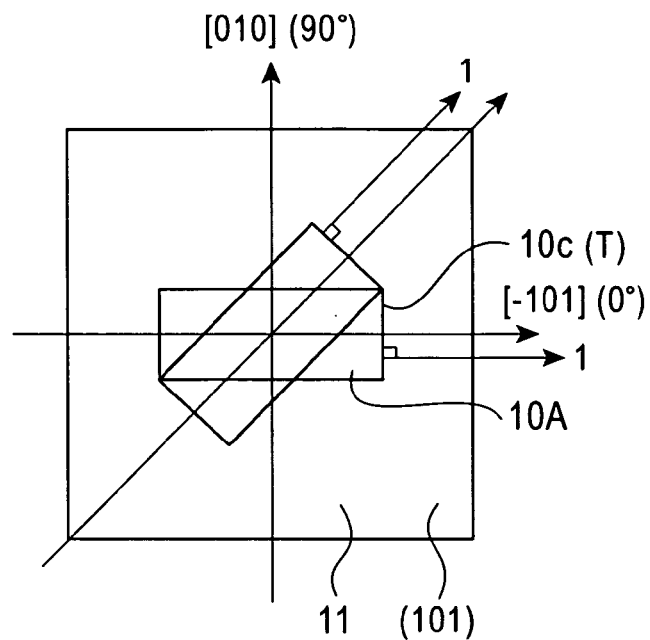
FIG. 9A is a diagram illustrating the direction of cutting out a piezoelectric single crystal device 10A from a single crystal wafer 11 in which the normal direction 1 to the edge face 10c (or T) of the piezoelectric device is in the range of 0 to 90°.
Figure 9B:
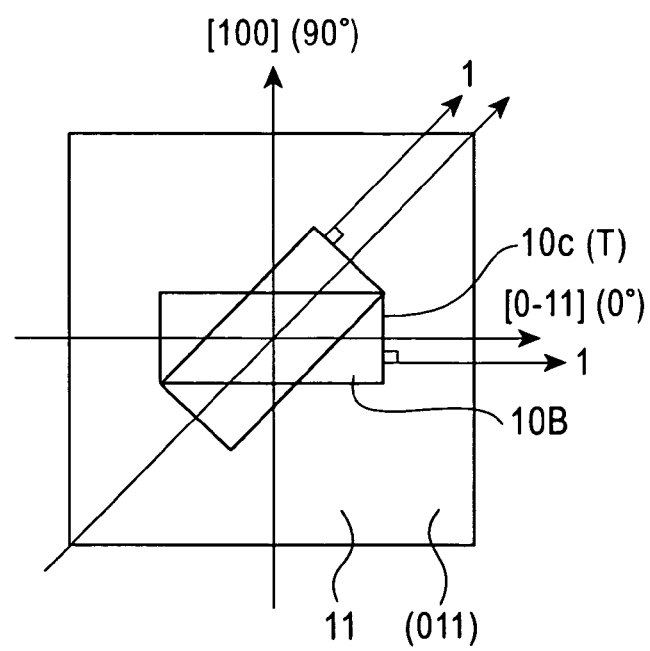
FIG. 9B is a diagram illustrating the direction of cutting out a piezoelectric single crystal device 10B from a single crystal wafer 11 in which the normal direction 1 to the edge face 10c (or T) of the piezoelectric device is in the range of 0 to 90°.

Specifically, in the piezoelectric single crystal device 10A, as shown in FIG. 9A, the normal direction 1 to the edge face T (10c) of the piezoelectric single crystal device was changed from 0° ([-101] direction) to 90° ([010] direction) in increments of 5° in order to examine the magnitude of the electromechanical coupling factor $k_{31}$. On the other hand, in the piezoelectric single crystal device 10B, as shown in FIG. 9B, the normal direction 1 to the edge face T (10c) of the piezoelectric single crystal device was changed from 0° ([0-11] direction) to 90° ([100] direction) in increments of 5° in order to examine the magnitude of the electromechanical coupling factor $k_{31}$. Then, a Cr—Au film (first Cr layer: about 50 nm in thickness, second Au layer: about 100 to 200 nm in thickness) was formed by sputtering on the opposing top and bottom faces 10a and 10b of each of the fabricated single crystal devices to form gold electrodes. The polarization was performed at 25° C. in air under a condition in which a DC electric field of 700 V/mm was applied for 60 minutes in the directions ([101] direction and [011] direction) perpendicular to the drawings of FIGS. 9A and 9B, respectively. The electromechanical coupling factors $k_{31}$ of the piezoelectric single crystal devices 10A and 10B were calculated according to the known arithmetic expression (refer to Electronic Material Industrial Standard: EMAS-6008, 6100). The measured results are shown in Tables 1 and 2.

The reason for selecting the range of 0° to 90° with respect to the [-101] axial direction (FIG. 9A) or the [0-11] axial direction (FIG. 9B) in the plane substantially orthogonal to the polarization direction 3 is that this angle range is necessary and sufficient to obtain information relating to all directions within the crystal face orthogonal to the polarization direction in view of symmetry of a tetragonal crystal. For the purpose of reference, the electromechanical coupling factor $k_{31}$ of a piezoelectric device fabricated as a conventional example from a sintered body ceramic (PZT) of lead zirconate titanate (Pb(Zr, Ti)O$_3$) is also shown in Tables 1 and 2. Unlike the piezoelectric single crystal described herein, PZT is a sintered body ceramic and does not have anisotropy accompanying crystal orientation, and thus the electromechanical coupling factor $k_{31}$ in the lateral vibration mode is the same value in all crystal orientations regardless of the normal direction 1 to the edge face T (10c).

The results shown in Table 1 reveal that only within the angle range of 0° to 25° (equivalent to the angle range −25° to +25° in view of symmetry of a crystal (tetragonal)), within the face orthogonal to the polarization direction 3 including the [-101] axis, the piezoelectric single crystal device 10A exhibits an electromechanical coupling factor $k_{31}$ of 50% or more and is suitable as a piezoelectric device employing lateral vibration.

Also, the results shown in Table 2 reveal that only within the angle range of ±25° with respect to the [0-11] axis within the face orthogonal to the polarization direction 3 including the [0-11] axis, the piezoelectric single crystal device 10B exhibits an electromechanical coupling factor $k_{31}$ of 50% or more and is suitable as a piezoelectric device employing lateral vibration.

Furthermore, as a result of detailed measurement of the electromechanical coupling factor $k_{31}$ within this angle range in increments other than 5°, it was confirmed that $k_{31}$ is consistently 50% or more.

Furthermore, in this example, with the [101] axis of the single crystal device as the polarization direction, confirmation was made of preferable orientation in which the (101) face as the widest face of the piezoelectric single crystal device of 13 mm length×4 mm width×0.36 mm is orthogonal to the [101] direction. Alternatively, with the [011] axis of the single crystal device as the polarization direction, confirmation was made of preferable orientation in which the (011) face as the widest face of the piezoelectric single crystal device of 13 mm length×4 mm width×0.36 mm is orthogonal to the [011] direction. As a result, $k_{31}$ was as high as 54.3% at an angle of +15° with respect to the [-101] axis on the (010) face orthogonal to the (101) face in which the normal direction 1 to the edge face T shown in FIG. 5 is within the solid-angle range of ±25° with respect to the [-101] axis. Also, $k_{31}$ was as high as 55.2% at an angle of +15° with respect to the [0-11] axis on the (100) face orthogonal to the (011) face in which the normal direction 1 to the edge face T shown in FIG. 6 is within the solid-angle range of ±25° with respect to the [0-11] axis.

A piezoelectric single crystal device was fabricated using lead indium magnesium niobate (PIMN) and lead titanate (PT) (65PIMN-35PT) by the same method as described above, and the electromechanical coupling factor $k_{31}$ was examined under the same test conditions as described above. As a result, it was confirmed from Tables 1 and 2 that like with 64PMN-36PT, a high electromechanical coupling factor $k_{31}$ can be obtained. In this case, the indium content was 20 mol %.

EXAMPLE 2

Next, as the piezoelectric single crystal device 10A with the [101] direction as the polarization direction and the piezoelectric single crystal device 10B with the [011] direction as the polarization direction, the single crystal devices Nos. 1 to 11 composed of Pb[(Mg, Nb)$_{1-x}$Ti$_x$]O$_3$ with different Ti molar fractions shown in Tables 3 and 4 were fabricated by the same method as in EXAMPLE 1, and electromechanical factors $k_{31}$ were calculated by the same method as in EXAMPLE 1. The results are shown in Table 3 and 4. Each of the electromechanical coupling factors $k_{31}$ shown in Tables 3 and 4 is an average value of each single crystal device with a sample number n=5. The compositions of the piezoelectric single crystal devise 10A and 10B were the same as in EXAMPLE 1. The piezoelectric single crystal devices 10A and 10B were fabricated by cutting out single crystal device materials of a size of 13 mm length×4 mm width×0.36 mm using a dicing saw to realize the orientations of the piezoelectric single crystal devices 10A and 10B in which as in EXAMPLE 1, the normal direction 1 to the piezoelectric device edge face T (10c) was 0° with respect to the [-101] axis and the [0-11] axis, respectively.

The results shown in Tables 3 and 4 indicate that in any one of samples of the piezoelectric single crystal devices 10A and 10B according to the invention in which the Ti molar faction satisfies 0.30<X<0.40, an electromechanical coupling factor $k_{31}$ of as high as 50% or more is stably obtained.

EXAMPLE 3

Next, a preferable polarization processing method for fabricating a piezoelectric single crystal device preferable for utilizing the lateral vibration mode will be described below. Table 5 shows the results of measurement of the electromechanical coupling factors $k_{31}$ of the piezoelectric single crystal device 10A with the [101] direction as the polarization direction and the piezoelectric single crystal device 10B with the [011] direction as the polarization direction, these piezoelectric single crystal devices being fabricated under various polarization processing conditions. The fabricating method, the device dimensions, and the test conditions for the piezoelectric single crystal devices were the same as in EXAMPLE 1. The piezoelectric single crystal devices 10A and 10B had the same composition as in EXAMPLE 1 and were fabricated by cutting out single crystal device materials of a size of 13 mm length×4 mm width×0.36 mm using a dicing saw to realize the orientations of the piezoelectric single crystal devices 10A and 10B in which as in EXAMPLE 1, the normal direction 1 to the piezoelectric device edge face T (10c) was 15° with respect to the [-101] axis and the [0-11] axis, respectively.

In Table 5, Nos. (1) to (7) are piezoelectric single crystal devices fabricated under polarization processing conditions in which a DC electric field of 350 to 1500 V/mm was applied for 30 to 180 minutes within the temperature range of 25° C. to 60° C. In this case, with lead magnesium niobate (PMN) and lead titanate (PT) (Ti molar fraction X: 36 mol %), electromechanical coupling factors $k_{31}$ in the direction (lateral vibration mode) orthogonal to the polarization direction of a crystal preferable for utilizing the lateral vibration mode were 51.6% to 61.0% with the piezoelectric single crystal device 10A and 52.0% to 61.2% with the piezoelectric single crystal ice 10B. The electromechanical complying factor $k_{31}$ was 50% or more with both piezoelectric simple crystal devices 10A and 10B.

With respect to lead indium magnesium niobate (PIMN) and lead titanate (PT) (PIMN-PT), piezoelectric single crystal devices were fabricated by the same method as that for lead magnesium niobate (PMN) and lead titanate (PT), and electromechanical coupling factors $k_{31}$ were measured under the same test conditions as those for lead magnesium niobate (PMN) and lead titanate (PT). Table 5 indicates that a piezoelectric single crystal device exhibiting an electromechanical coupling factor $k_{31}$ of as high as 50% or more is obtained by applying a DC current of 350 to 1500 V/mm in the temperature range of 25° C. to 60° C. With any one of the piezoelectric single crystal devices having a composition containing lead magnesium niobate (PMN), lead titanate (PT) (Ti molar faction X: 45 mol %), and In (20 mol %) in an appropriate range, the same result as with the composition containing lead magnesium niobate (PMN) and lead titanate (PT) (Ti molar fraction X: 36 mol %) was obtained.

The present invention includes a temperature range and electric field range of primary polarization processing conditions out of the above-descried preferable ranges. However, when the polarization processing temperature of a single crystal device was 25° C. and the applied electric field was 320 V/mm lower than the lower limit of the preferable range of the present invention, in the 64PMN-36PT device and the 65PIMN-35PT of examples of the invention, the electromechanical coupling factors $k_{31}$ of the piezoelectric single crystal devices 10A and 10B were less than 50% in some cases.

In addition, when the temperature of a single crystal device was 40° C. and the applied electric field was 1700 V/mm over the upper limit of the preferable range of the present invention, in the 64PMN-36PT device and the 65PIMN-35PT of examples of the invention, the electromechanical coupling factors $k_{31}$ of the piezoelectric single crystal devices 10A and 10B were less than 50% in some cases, and cracks occurred in the piezoelectric single crystal devices during the application of the electric field or immediately after the application in some examples.

Furthermore, when the temperature was decreased to room temperature (25° C.) in silicone oil over 120 minutes with the DC electric field of 400 V/mm applied to a single crystal device in the silicone oil at 210° C. higher than the Curie temperature Tc shown in FIG. 4, with lead magnesium niobate (PMN) and lead titanate (PT) (Ti molar fraction X: 36 mol %), the electromechanical coupling factor $k_{31}$ in the direction (lateral vibration mode) orthogonal to the polarization direction was 58.6% with the piezoelectric single crystal device 10A and 58.4% with the piezoelectric single crystal ice 10B, as shown in No. (8) in Table 5. With respect to a piezoelectric single crystal device (PIMN-PT) having a composition containing lead magnesium niobate (PMN), lead titanate (PT) (Ti molar fraction X: 45 mol %), and In (30 mol %) in an appropriate range, electromechanical coupling factors $k_{31}$ were measured under the same test conditions as those for lead magnesium niobate (PMN) and lead titanate (PT). As a result, as shown in No. (8) in Table 5, $k_{31}$ was 57.3% with the piezoelectric single crystal device 10A and 58.1% with the piezoelectric single crystal device 10B and improved like with lead magnesium niobate (PNM) and lead titanate (PT).

These results indicate that the method of cooling with the electric field applied (electric field cooling) is effective.

In the 64PMN-36PT device and the 65PIMN-35PT device of examples of the invention, with the applied electric field less than 250 V/mm, the electromechanical coupling factors $k_{31}$ of the piezoelectric single crystal devices 10A and 10B were less than 50% in some cases. This is possibly due to the fact that the electric field less than 200 V/mm causes insufficient polarization. On the other hand, in the 64PMN-36PT device and the 65PIMN-35PT device of examples of the invention, with the applied electric field over 500 V/mm, the electromechanical coupling factors $k_{31}$ of the piezoelectric single crystal devices 10A and 10B were less than 50% in some cases, and cracks occurred in the piezoelectric single crystal devices during the application of the electric field of 600 V/mm or immediately after the application in some cases.

As described above, in the 64PMN-36PT device and the 65PIMN-35PT device of examples of the invention, a satisfactory electromechanical coupling factor $k_{31}$ is stably obtained with both the piezoelectric single crystal devices 10A and 10B under the preferable polarization conditions of the invention.

EXAMPLE 4

Next, a preferable auxiliary polarization processing method for fabricating a piezoelectric single crystal device preferable for utilizing the lateral vibration mode will be described below. Table 6 shows the results of measurement of the electromechanical coupling factors $k_{31}$ of piezoelectric single crystal devices fabricated under various auxiliary polarization processing conditions. The fabricating method, the device dimensions, and the test conditions for the piezoelectric single crystal devices were the same as in EXAMPLE 1. The piezoelectric single crystal devices 10A and 10B had the same composition as in EXAMPLE 1 and were fabricated by cutting out single crystal device materials of a size of 13 mm length×4 mm width×0.36 mm using a dicing saw to realize the orientations of the piezoelectric single crystal devices 10A and 10B in which as in EXAMPLE 1, the normal direction 1 to the piezoelectric device edge face T (10c) was 15° with respect to the [-101] axis and the [0-11] axis, respectively.

A Cr—Au film (first Cr layer: about 50 nm in thickness, second Au layer: about 100 to 200 nm in thickness) was formed by sputtering on each of both edge faces 10c (T) of a crystal suitable for utilizing the lateral vibration mode, which was fabricated by the same method as in EXAMPLE 1 to form electrodes. Then, auxiliary polarization processing was performed by applying a DC electric field of 320 to 1700 V/mm for a time of 10 minutes to 150 minutes at an auxiliary polarization processing temperature of 25° C. to 40° C. Then, the electrodes were completely removed by dissolution with an etching solution or an acid, and a Cr—Au film (first Cr layer: about 50 nm in thickness, second Au layer: about 100 to 200 nm in thickness) was formed by sputtering on each of the opposing top and bottom faces 10a and 10b of a single crystal device material 10 to form electrodes, and main polarization processing was performed by applying a DC electric field of 700 V/mm for 60 minutes at 25° C. in air. The measured electromechanical coupling factors $k_{31}$ are shown in Table 6. In Table 6, Nos. (1) to (5) were piezoelectric single crystal devices fabricated under auxiliary polarization processing conditions in which a DC electric field of 350 to 1500 V/mm was applied for 10 to 120 minutes in the temperature range of 25° C. to 40° C.

In this case, with lead magnesium niobate (PMN) and lead titanate (PT) (Ti molar fraction X: 36 mol %), the electromechanical coupling factor $k_{31}$ was 60% or more with both piezoelectric single crystal devices 10A and 10B, as compared with No. (9) in Table 6 without auxiliary polarization processing in which $k_{31}$ was 59.8% with the piezoelectric single crystal device 10A and 59.1% with the piezoelectric single crystal device 10B. Therefore, the electromechanical coupling factor $k_{31}$ was further increased by the auxiliary polarization processing. Also, in No. (6) in which auxiliary polarization processing was performed under the same conditions as described above in (2) after primary polarization processing, the electromechanical coupling factor $k_{31}$ was 62.4% with the piezoelectric single crystal device 10A and 62.8% with the piezoelectric single crystal device 10B, and high electromechanical coupling factors $k_{31}$ were obtained.

Furthermore, in Nos. (7) and (8) in which a bipolar triangular pulse electric field shown in FIG. 7 was applied for 10 minutes before or after the primary polarization processing, high electromechanical coupling factors $k_{31}$ were obtained.

With respect to a composition containing lead magnesium niobate (PMN), lead titanate (PT) (Ti molar fraction X: 45 mol %), and In (30 mol %) in an appropriate range, piezoelectric single crystal devices (PIMN-PT) were fabricated by the same method as that for lead magnesium niobate (PMN) and lead titanate (PT), and electromechanical coupling factors $k_{31}$ were measured under the same test conditions as those for lead magnesium niobate (PMN) and lead titanate (PT). Nos. (1) to (8) in Table 6 indicate that like in the case of lead magnesium niobate (PMN) and lead titanate (PT), with a crystal suitable for utilizing the lateral vibration mode, the electromechanical coupling factor $k_{31}$ was improved by auxiliary polarization processing before or after primary polarization processing under the auxiliary polarization processing conditions in which a DC electric field of 350 to 1500 V/mm or a bipolar triangular pulse electric field was applied at the temperature range of 25° C. to 40° C.

On the other hand, when the auxiliary polarization processing temperature of a piezoelectric single crystal device was 25° C. and the applied electric field was 320 V/mm lower than the lower limit of the preferable range of the invention, in the 64PMN-36PT device and the 65PIMN-35PT device of examples of the invention, the electromechanical coupling factors $k_{31}$ of the piezoelectric single crystal devices 10A and 10B were less than 50% in some cases.

Furthermore, when the temperature of a piezoelectric single crystal device fabricated by the same method as in EXAMPLE 1 was 40° C. and the applied electric field was 1700 V/mm over the upper limit of the preferable range of the invention, in the 64PMN-36PT device and the 65PIMN-35PT device of examples of the invention, the electromechanical coupling factors $k_{31}$ of the piezoelectric single crystal devices 10A and 10B were less than 50% in some cases, and cracks occurred in the piezoelectric single crystal devices in some cases.

EXAMPLE 5

Next, according to the present invention, various types of the piezoelectric single crystal devices 10A and 10B composed of lead magnesium niobate (PNM) and lead titanate (PT) (PMN-PT) (composition formula: $Pb[(Mg, Nb)_{1-X}Ti_X]O_3$) in which the Ti molar fraction X satisfies 0.30<X<0.40 (over 30 mol % and less than 40 mol %) were fabricated, and changes in dielectric constant with temperature were measured to determine the Curie temperatures Tc and the phase transition temperatures $T_{rt}$. The piezoelectric single crystal devices 10A and 10B were fabricated by cutting out single crystal device materials of a size of 13 mm length×4 mm width×0.36 mm using a dicing saw to realize the orientations of the piezoelectric single crystal devices 10A and 10B in which as in EXAMPLE 1, the normal direction 1 to the piezoelectric device edge face T (10c) was 0° with respect to the [-101] axis and the [0-11] axis, respectively.

Figure 10:
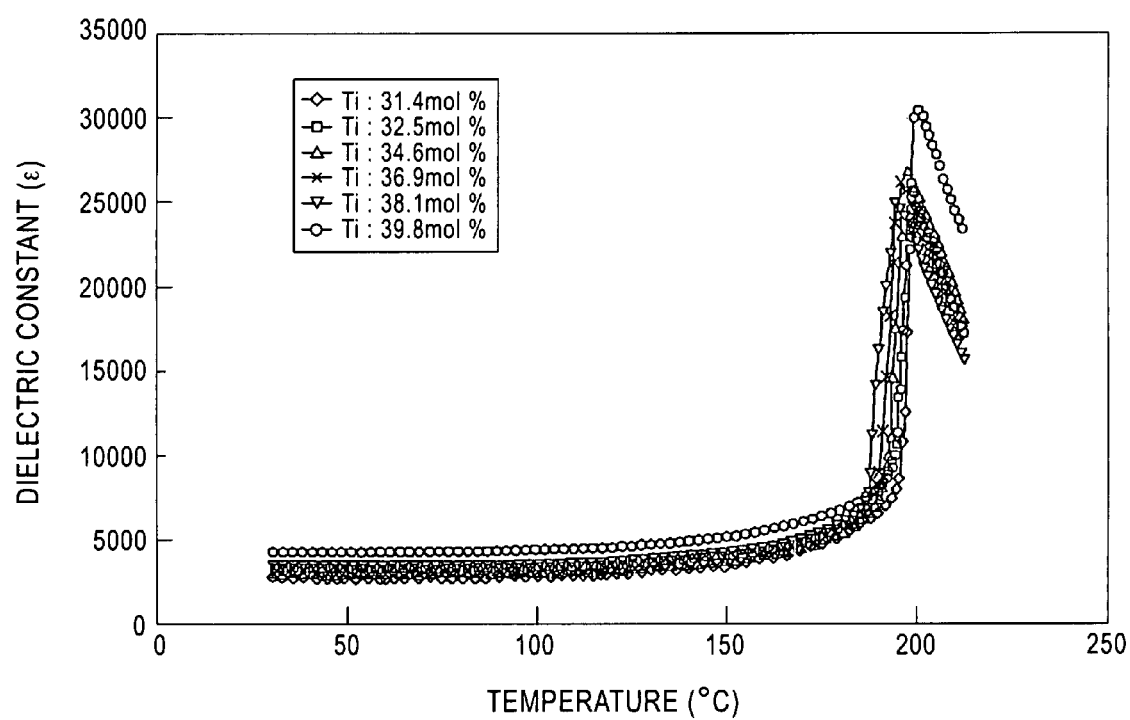
FIG. 10 is a plot diagram showing changes in the dielectric constant of each of piezoelectric single crystal devices 10A and 10B of the present invention with temperature, in which the molar fraction X of Ti satisfies 0.30<X<0.40.

The results are shown in FIG. 10. For the purpose of reference, various piezoelectric single crystal devices having a Ti molar fraction X of 0.3 or less (30 mol % or less) were fabricated by the same method as the above, and changes in dielectric constant with temperature were measured to determine the Curie temperatures Tc and the phase transition temperatures $T_{rt}$. The results are shown in FIG. 11.

As shown in FIG. 10, in any one of the piezoelectric single crystal devices 10A and 10B of the invention in which the Ti molar fraction X satisfies 0.30<X<0.40 (over 30 mol % and less than 40 mol %), the Curie temperature is Tc is as high as 160° C. or more, and the phase transition temperature $T_{rt}$ is room temperature or less because a tetragonal structure is superior to a pseudocubic structure. This means that within the temperature range of room temperature to a high temperature (e.g., 150° C.), the same crystal structure (tetragonal) can be maintained at room temperature and a high temperature without phase transition, and thus the piezoelectric properties of the piezoelectric single crystal devices 10A and 10B are little deteriorated at a high temperature.

Figure 11:
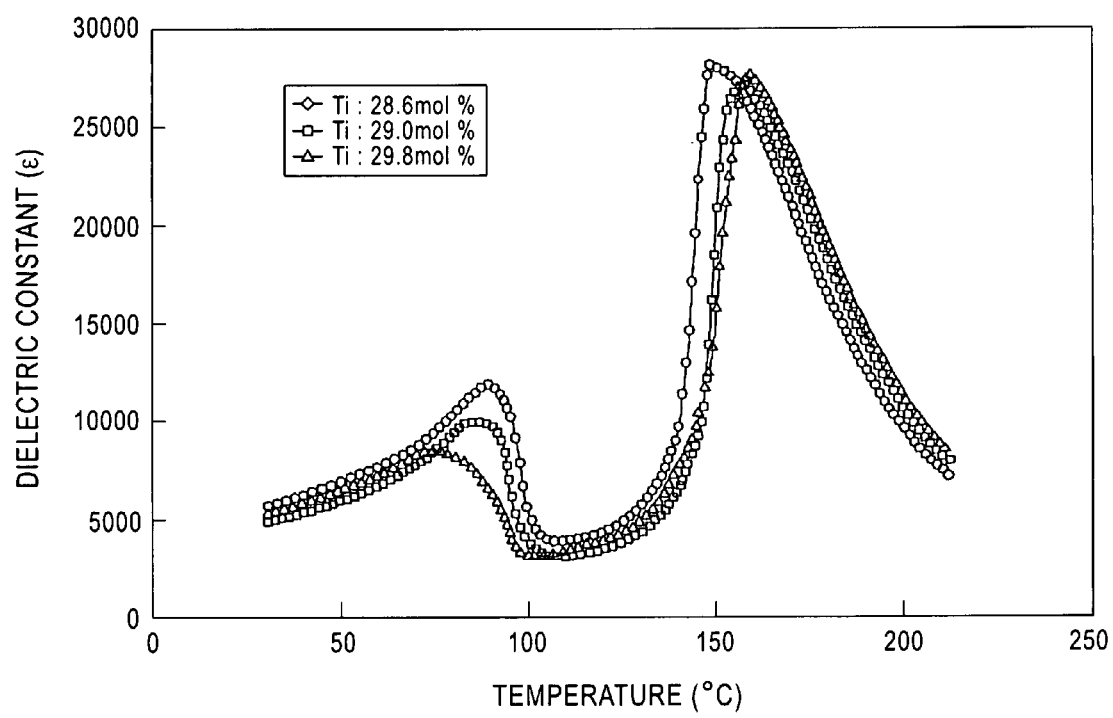
FIG. 11 is a plot diagram showing changes in the dielectric constant of each of piezoelectric single crystal devices 10A and 10B of the present invention with temperature, in which the molar fraction X of Ti is 0.30 or less.

On the other hand, as shown in FIG. 11, in the piezoelectric single crystal devices having a Ti molar fraction X of 0.3 or less (30 mo % or less), the Curie temperature Tc is as low as 130° C. to 155° C., and the phase transition temperature $T_{rt}$ is as low as 90° C. or less. This means that within the temperature range of room temperature to a high temperature (e.g., 150° C.), a rhombohedral structure is superior at room temperature, and phase transition to a superior tetragonal structure occurs at a high temperature. Namely, the same crystal structure (tetragonal) cannot be maintained at room temperature and a high temperature, and thus the piezoelectric properties of the piezoelectric single crystal device 10A and 10B are deteriorated at a high temperature.

Figure 12A:
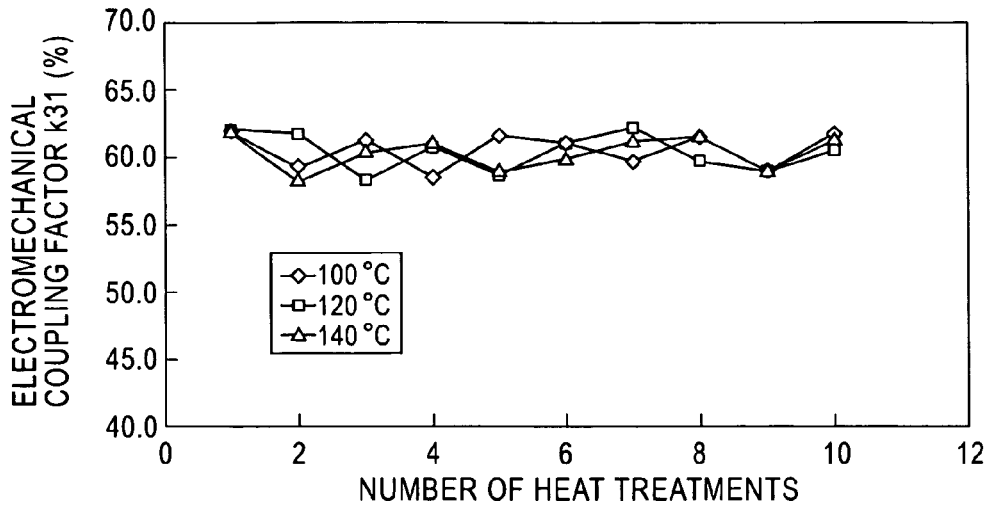
FIG. 12A is a plot diagram showing changes in the electromechanical coupling factor $k_{31}$ of a piezoelectric single crystal device 10A of the present invention in repeated heat cycle tests, in which the molar fraction X of Ti satisfies 0.30<X<0.40.
Figure 12B:
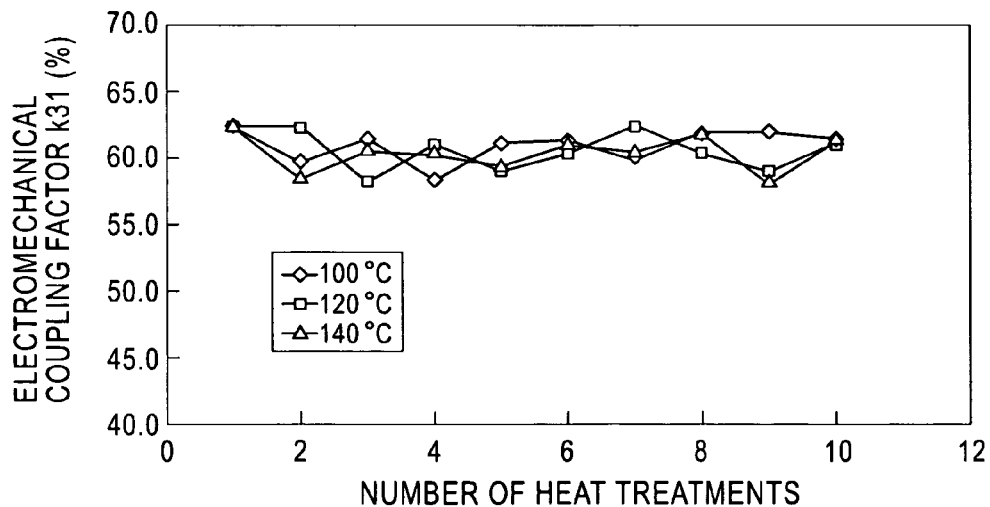
FIG. 12B is a plot diagram showing changes in the electromechanical coupling factor $k_{31}$ of a piezoelectric single crystal device 10B of the present invention in repeated heat cycle tests, in which the molar fraction X of Ti satisfies 0.30<X<0.40.

FIG. 12A is a plot diagram showing changes in the value of the electromechanical coupling factor $k_{31}$ in repeated heat cycle tests between room temperature and high temperatures (e.g., 100° C., 120° C., 140° C.) using the piezoelectric single crystal device 10A of the invention in which the Ti molar fraction X satisfies 0.30<X<0.40 (over 30 mol % and less than 40 mol %). FIG. 12B is a plot diagram showing changes in the value of the electromechanical coupling factor $k_{31}$ in the lateral vibration mode in repeated heat cycle tests between room temperature and high temperatures (e.g., 100° C., 120° C., 140° C.) using the piezoelectric single crystal device 10B of the invention in which the Ti molar fraction X satisfies 0.30<X<0.40 (over 30 mol % and less than 40 mol %). A heat cycle test was performed under the conditions in which the temperature was increased from room temperature to each of 100° C. (retention time: 60 minutes), 120° C. (retention time: 30 minutes), and 140° C. (retention time: 15 minutes) and maintained at each temperature and then decreased to room temperature, followed by measurement. Then, a heat treatment was further performed under the conditions. For the purpose of reference, FIG. 13 is a plot diagram showing changes in the value of the electromechanical coupling factor $k_{31}$ in the lateral vibration mode in repeated heat cycle tests using a piezoelectric single crystal device in which the Ti molar fraction X 0.30 or less (30 mol % or less).

These figures indicate that in any one of the piezoelectric single crystal devices 10A and 10B of the invention in which the Ti molar fraction X satisfies 0.30<X<0.40 (over 30 mol % and less than 40 mol %), the value of the electromechanical coupling factor $k_{31}$ in the lateral vibration mode little changes in the repeated heat cycle tests.

Figure 13:
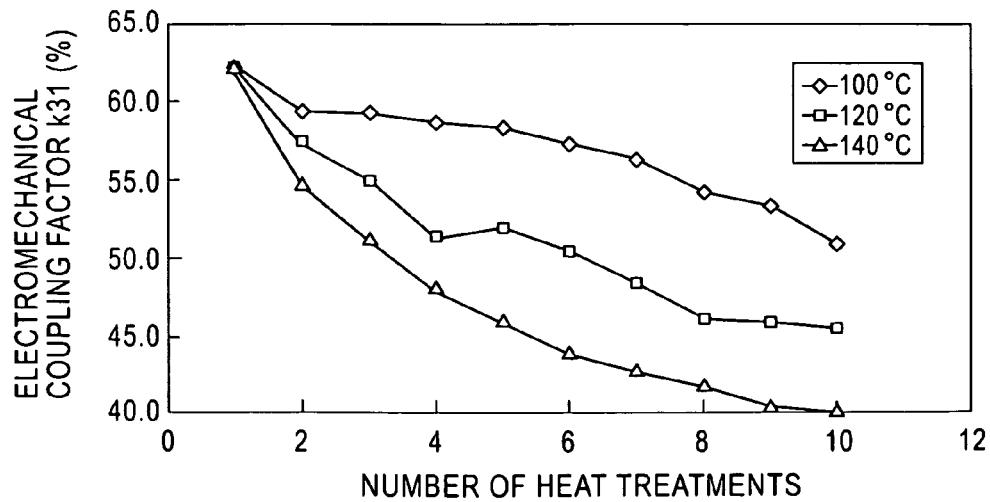
FIG. 13 is a plot diagram showing changes in the electromechanical coupling factor $k_{31}$ of each of piezoelectric single crystal devices 10A and 10B in repeated heat cycle tests, in which the molar fraction X of Ti is 0.30 or less.

On the other hand, FIG. 13 shows that in the piezoelectric single crystal device in which the Ti molar fraction X is 0.30 or less (30 mol % or less), the value of the electromechanical coupling factor $k_{31}$ in the lateral vibration mode significantly decreases in the repeated heat cycle tests.

INDUSTRIAL APPLICABILITY

According to the present invention, it is possible to fabricate a piezoelectric single crystal device used in applications positively utilizing an electromechanical coupling factor $k_{31}$ in a direction (lateral vibration mode) orthogonal to the polarization direction, for example, magnetic head precise positioning actuators, piezoelectric gyro devices, image stabilizers of digital still cameras, cardiac pacemaker sensors, and the like. In particular, a piezoelectric single crystal device of the present invention is capable of stably maintaining the electromechanical coupling factor $k_{31}$ in the lateral vibration mode at a high value without a decrease even in a high-temperature (specifically, 150° C.) operating environment.

TABLE 1

| | | Electromechanical coupling factor $k_{31}$ of piezoelectric single crystal device 10A (%) | | |
|---|---|---|---|---|
| Crystal orientation | Angle (°) | 64PMN-36PT (Ti: 36 mol %) | 65PIMN-35PT (Ti: 35 mol %) (In: 20 mol %) | Pb(Zr, Ti)O$_3$ |
| [-101] | 0 | 62.0 | 61.5 | 30 |
| | 5 | 62.1 | 62.3 | |
| | 10 | 61.8 | 61.3 | |
| | 15 | 59.8 | 58.2 | |
| | 20 | 54.3 | 55.4 | |
| | 25 | 51.3 | 52.0 | |
| | 30 | 41.2 | 39.8 | |
| | 35 | 30.0 | 30.1 | |
| | 40 | 28.3 | 27.6 | |
| | 45 | 27.3 | 27.0 | |
| | 50 | 27.1 | 26.7 | |
| | 55 | 25.1 | 24.3 | |
| | 60 | 26.8 | 24.2 | |
| | 65 | 24.8 | 23.0 | |
| | 70 | 24.9 | 24.9 | |
| | 75 | 25.0 | 25.1 | |
| | 80 | 23.7 | 23.3 | |
| | 85 | 23.5 | 23.6 | |
| [010] | 90 | 23.8 | 23.7 | |

TABLE 2

| | | Electromechanical coupling factor $k_{31}$ of piezoelectric single crystal device 10B (%) | | |
|---|---|---|---|---|
| Crystal orientation | Angle (°) | 64PMN-36PT (Ti: 36 mol %) | 65PIMN-35PT (Ti: 35 mol %) (In: 20 mol %) | Pb(Zr, Ti)O$_3$ |
| [0-11] | 0 | 62.1 | 61.8 | 30 |
| | 5 | 62.0 | 61.9 | |
| | 10 | 61.3 | 60.3 | |
| | 15 | 59.1 | 60.2 | |
| | 20 | 54.2 | 53.6 | |
| | 25 | 51.4 | 51.2 | |
| | 30 | 42.6 | 41.6 | |
| | 35 | 31.0 | 31.3 | |
| | 40 | 29.6 | 29.5 | |
| | 45 | 26.1 | 25.8 | |
| | 50 | 26.3 | 26.0 | |
| | 55 | 25.2 | 25.0 | |

TABLE 2-continued

| | | Electromechanical coupling factor $k_{31}$ of piezoelectric single crystal device 10B (%) | | |
|---|---|---|---|---|
| Crystal orientation | Angle (°) | 64PMN-36PT (Ti: 36 mol %) | 65PIMN-35PT (Ti: 35 mol %) (In: 20 mol %) | Pb(Zr, Ti)O₃ |
| | 60 | 26.0 | 24.6 | |
| | 65 | 24.2 | 24.1 | |
| | 70 | 24.8 | 24.2 | |
| | 75 | 23.7 | 23.0 | |
| | 80 | 23.6 | 23.2 | |
| | 85 | 23.5 | 23.1 | |
| [100] | 90 | 23.8 | 23.5 | |

TABLE 3

| | Piezoelectric single crystal device 10A | | | Evaluation result | |
|---|---|---|---|---|---|
| Sample No. | PMN mol % | PT mol % | Ti mol % | Electromechanical coupling factor $k_{31}$ (%) | Remarks |
| 1 | 72.0 | 28.0 | 28.0 | 47.3 | Comparative Example |
| 2 | 69.9 | 30.1 | 30.1 | 53.0 | Example of this invention |
| 3 | 67.9 | 32.1 | 32.1 | 57.0 | Example of this invention |
| 4 | 66.7 | 33.3 | 33.3 | 59.8 | Example of this invention |
| 5 | 64.3 | 35.6 | 35.6 | 60.3 | Example of this invention |
| 6 | 63.7 | 36.3 | 36.3 | 61.8 | Example of this invention |
| 7 | 62.6 | 37.4 | 37.4 | 62.0 | Example of this invention |
| 8 | 61.5 | 38.5 | 38.5 | 57.0 | Example of this invention |
| 9 | 60.1 | 39.9 | 39.9 | 53.0 | Example of this invention |
| 10 | 59.5 | 40.5 | 40.5 | 46.8 | Comparative Example |
| 11 | 56.0 | 44.0 | 44.0 | 40.2 | Comparative Example |

TABLE 4

| | Piezoelectric single crystal device 10B | | | Evaluation result | |
|---|---|---|---|---|---|
| Sample No. | PMN mol % | PT mol % | Ti mol % | Electromechanical coupling factor $k_{31}$ (%) | Remarks |
| 1 | 71.9 | 28.1 | 28.1 | 47.6 | Comparative Example |
| 2 | 69.7 | 30.3 | 30.3 | 53.2 | Example of this invention |
| 3 | 67.4 | 32.6 | 32.6 | 57.3 | Example of this invention |
| 4 | 66.5 | 33.5 | 33.5 | 59.7 | Example of this invention |
| 5 | 64.3 | 35.7 | 35.7 | 60.5 | Example of this invention |
| 6 | 63.7 | 36.3 | 36.3 | 61.8 | Example of this invention |
| 7 | 62.5 | 37.5 | 37.5 | 62.1 | Example of this invention |
| 8 | 61.4 | 38.6 | 38.6 | 57.3 | Example of this invention |
| 9 | 59.9 | 39.9 | 39.9 | 53.2 | Example of this invention |
| 10 | 59.7 | 40.3 | 40.3 | 46.3 | Comparative Example |
| 11 | 56.0 | 44.0 | 44.0 | 39.8 | Comparative Example |

TABLE 5

| | Polarization condition | | | Electromechanical coupling factor $k_{31}$ (%) | | | | |
|---|---|---|---|---|---|---|---|---|
| | | | | 64PMN-36PT (Ti: 36 mol %) | | 65PIMN-35PT (Ti: 35 mol %) (In: 20 mo %) | | Remarks |
| | Temperature °C. | Electric field V/mm | Time min | 10A | 10B | 10A | 10B | |
| (1) | 25 | 350 | 180 | 51.6 | 52.0 | 51.5 | 50.8 | Example of this invention |
| (2) | 60 | 400 | 180 | 56.8 | 56.5 | 56.4 | 56.9 | Example of this invention |
| (3) | 25 | 700 | 100 | 60.6 | 61.2 | 60.4 | 60.8 | Example of this invention |
| (4) | 25 | 700 | 60 | 59.8 | 59.1 | 59.2 | 59.3 | Example of this invention |
| (5) | 40 | 900 | 70 | 61.0 | 60.3 | 60.4 | 60.4 | Example of this invention |
| (6) | 30 | 1200 | 60 | 60.9 | 60.8 | 61.0 | 60.4 | Example of this invention |
| (7) | 40 | 1500 | 30 | 59.6 | 57.8 | 58.3 | 58.4 | Example of this invention |
| (8) | 210→25 electric field cooling | 400 | 120 | 58.6 | 58.4 | 57.3 | 58.1 | Example of this invention |

10A: Piezoelectric single crystal device 10A
10B: Piezoelectric single crystal device 10B

TABLE 6

| | Auxiliary polarization condition | | | | Electromechanical coupling factor $k_{31}$ (%) | | | | |
|---|---|---|---|---|---|---|---|---|---|
| | Temp. | Type of electric field | Electric field | Time | Timing of auxiliary polarization | 64PMN-36PT (Ti: 36 mol %) | | 65PIMN-35PT (Ti: 35 mol %) (In: 20 mo %) | Remarks |
| | °C. | field | V/mm | min | polarization | 10A | 10B | 10A | 10B | |
| (1) | 40 | DC | 350 | 120 | Pre-processing | 60.4 | 60.3 | 60.2 | 60.4 | Example of this invention |
| (2) | 25 | DC | 700 | 100 | Pre-processing | 62.5 | 63.0 | 62.7 | 62.1 | Example of this invention |
| (3) | 40 | DC | 900 | 70 | Pre-processing | 62.4 | 62.5 | 62.3 | 62.5 | Example of this invention |
| (4) | 30 | DC | 1200 | 60 | Pre-processing | 61.8 | 61.8 | 61.3 | 61.5 | Example of this invention |
| (5) | 40 | DC | 1500 | 10 | Pre-processing | 61.4 | 60.8 | 60.4 | 61.3 | Example of this invention |
| (6) | 25 | DC | 700 | 100 | Post-processing | 62.4 | 62.8 | 62.3 | 62.4 | Example of this invention |
| (7) | 25 | Triangular wave pulse | Peak value 500 V/mm, interval 800 msec, | 10 min | Pre-processing | 61.2 | 60.8 | 60.4 | 61.0 | Example of this invention |
| (8) | 25 | | | | Post-processing | 61.4 | 60.9 | 60.5 | 60.6 | Example of this invention |
| (9) | | Unprocessed | | | | 59.8 | 59.1 | 59.2 | 59.3 | Example of this invention |

10A: Piezoelectric single crystal device 10A
10B: Piezoelectric single crystal device 10B

The invention claimed is:

1. A piezoelectric single crystal device;
wherein with a polarization direction along a [101] axis of a tetragonal system having a [001] axis as a C axis (with the largest lattice constant), a normal direction to an edge face thereof is within the solid-angle range of ±25° with respect to a [-101] axis which is substantially orthogonal to the polarization direction, the range including the [-101] axis; and
the electromechanical coupling factor $k_{31}$ in a direction substantially orthogonal to the polarization direction, i.e., in a lateral vibration mode, is 50% or more.

2. A piezoelectric single crystal device;
wherein with a polarization direction along a [011] axis of a tetragonal system having a [001] axis as a C axis (with the largest lattice constant), a normal direction to an edge face thereof is within the solid-angle range of ±25° with respect to a [0-11] axis which is substantially orthogonal to the polarization direction, the range including the [0-11] axis; and
the electromechanical coupling factor $k_{31}$ in a direction substantially orthogonal to the polarization direction, i.e., in a lateral vibration mode, is 50% or more.

3. The piezoelectric single crystal device according to claim 1, comprising a single crystal device material which is a solid solution of $Pb[(Mg, Nb)_{1-X}Ti_X]O_3$ (wherein X is the molar fraction of Ti relative to the total molar fraction of 1 of Mg, Nb, and Ti), X satisfying the relation 0.30<X<0.40 and the material having a complex perovskite structure.

4. The piezoelectric single crystal device according to claim 1, wherein the solid solution further contains 0.05 mol % to 30 mol % of In.

5. A method for fabricating the piezoelectric single crystal according to claim 1, the method comprising:
primary polarization processing for polarizing a single crystal ingot, a cut out single crystal block, or a cut out single crystal device by applying an electric field under predetermined conditions in a polarization direction along a [101] or [011] direction before or after a single crystal device material of a predetermined shape is cut out from the single crystal ingot in a predetermined direction.

6. The method for fabricating the piezoelectric single crystal device according to claim 5, the method comprising:
primary polarization processing for polarizing the single crystal ingot or the single crystal block by applying an electric field in the [101] or [011] direction under predetermined conditions; and
processing for cutting out a single crystal device of a predetermined shape in a predetermined direction from the single crystal ingot or the single crystal block.

7. The method for fabricating the piezoelectric single crystal device according to claim 5, wherein the primary polarization processing includes applying a DC electric field of 350 to 1500 V/mm in the temperature range of 20° C. to 200° C. in the [101] or [011] direction of the single crystal ingot or the single crystal block or cooling the single crystal ingot or the single crystal block to room temperature while applying a DC electric field of 250 to 500 V/mm at a temperature higher than the Curie temperature (Tc) thereof.

8. The method for fabricating the piezoelectric single crystal device according to claim 5, the method comprising:
processing for cutting out a single crystal device of a predetermined shape in a predetermined direction from the single crystal ingot; and
primary polarization processing for polarizing the single crystal device by applying an electric field in the [101] or [011] direction under predetermined conditions.

9. The method for fabricating the piezoelectric single crystal device according to claim 5, wherein the primary polarization processing includes applying a DC electric field of 350 to 1500 V/mm in the temperature range of 20° C. to 200° C. in the [101] or [011] direction of the single crystal device or cooling the single crystal device to room temperature while applying a DC electric field of 250 to 500 V/mm at a temperature higher than the Curie temperature (Tc) thereof.

10. The method for fabricating the piezoelectric single crystal device according to claim 5, further comprising auxiliary polarization processing for polarization by applying an electric field in a direction orthogonal to the polarization direction before or after the primary polarization processing.

11. The piezoelectric single crystal device according to claim 2, comprising a single crystal device material which is a solid solution of $Pb[(Mg, Nb)_{1-X}Ti_X]O_3$ (wherein X is the molar fraction of Ti relative to the total molar fraction of 1 of Mg, Nb, and Ti), X satisfying the relation 0.30<X<0.40 and the material having a complex perovskite structure.

12. The piezoelectric single crystal device according to claim 2, wherein the solid solution further contains 0.05 mol % to 30 mol % of In.

13. The piezoelectric single crystal device according to claim 3, wherein the solid solution further contains 0.05 mol % to 30 mol % of In.

14. The piezoelectric single crystal device according to claim 11, wherein the solid solution further contains 0.05 mol % to 30 mol % of In.

15. The method for fabricating the piezoelectric single crystal according to claim 2, the method comprising:
   primary polarization processing for polarizing a single crystal ingot, a cut out single crystal block, a cut out single crystal block, or a cut out single crystal device by applying an electric field under predetermined conditions in a polarization direction along a [101] or [011] direction before or after a single crystal device material of a predetermined shape is cut out from the single crystal ingot in a predetermined direction.

16. The method for fabricating the piezoelectric single crystal according to claim 3, the method comprising:
   primary polarization processing for polarizing a single crystal ingot, a cut out single crystal block, a cut out single crystal block, or a cut out single crystal device by applying an electric field under predetermined conditions in a polarization direction along a [101] or [011] direction before or after a single crystal device material of a predetermined shape is cut out from the single crystal ingot in a predetermined direction.

17. The method for fabricating the piezoelectric single crystal device according to claim 15, the method comprising:
   primary polarization processing for polarizing the single crystal ingot or the single crystal block by applying an electric field in the [101] or [011] direction under predetermined conditions; and
      processing for cutting out a single crystal device of a predetermined shape in a predetermined direction from the single crystal ingot or the single crystal block.

18. The method for fabricating the piezoelectric single crystal device according to claim 16, the method comprising:
   primary polarization processing for polarizing the single crystal ingot or the single crystal block by applying an electric field in the [101] or [011] direction under predetermined conditions; and
      processing for cutting out a single crystal device of a predetermined shape in a predetermined direction from the single crystal ingot or the single crystal block.

19. The method for fabricating the piezoelectric single crystal device according to claim 6, wherein the primary polarization processing includes applying a DC electric field of 350 to 1500 V/mm in the temperature range of 20° C. to 200° C. in the [101] or [011] direction of the single crystal ingot or the single crystal block or cooling the single crystal ingot or the single crystal block to room temperature while applying a DC electric field of 250 to 500 V/mm at a temperature higher than the Curie temperature (Tc) thereof.

20. The method for fabricating the piezoelectric single crystal device according to claim 17, wherein the primary polarization processing includes applying a DC electric field of 350 to 1500 V/mm in the temperature range of 20° C. to 200° C. in the [101] or [011] direction of the single crystal ingot or the single crystal block or cooling the single crystal ingot or the single crystal block to room temperature while applying a DC electric field of 250 to 500 V/mm at a temperature higher than the Curie temperature (Tc) thereof.

21. The method for fabricating the piezoelectric single crystal device according to claim 18, wherein the primary polarization processing includes applying a DC electric field of 350 to 1500 V/mm in the temperature range of 20° C. to 200° C. in the [101] or [011] direction of the single crystal ingot or the single crystal block or cooling the single crystal ingot or the single crystal block to room temperature while applying a DC electric field of 250 to 500 V/mm at a temperature higher than the Curie temperature (Tc) thereof.

22. The method for fabricating the piezoelectric single crystal device according to claim 15, the method comprising:
   processing for cutting out a single crystal device of a predetermined shape in a predetermined direction from the single crystal ingot; and
   primary polarization processing for polarizing the single crystal device by applying an electric field in the [101] or [011] direction under predetermined conditions.

23. The method for fabricating the piezoelectric single crystal device according to claim 16, the method comprising:
   processing for cutting out a single crystal device of a predetermined shape in a predetermined direction from the single crystal ingot; and
   primary polarization processing for polarizing the single crystal device by applying an electric field in the [101] or [011] direction under predetermined conditions.

24. The method for fabricating the piezoelectric single crystal device according to claim 8, wherein the primary polarization processing includes applying a DC electric field of 350 to 1500 V/mm in the temperature range of 20° C. to 200° C. in the [101] or [011] direction of the single crystal device or cooling the single crystal device to room temperature while applying a DC electric field of 250 to 500 V/mm at a temperature higher than the Curie temperature (Tc) thereof.

25. The method for fabricating the piezoelectric single crystal device according to claim 22, wherein the primary polarization processing includes applying a DC electric field of 350 to 1500 V/mm in the temperature range of 20° C. to 200° C. in the [101] or [011] direction of the single crystal device or cooling the single crystal device to room temperature while applying a DC electric field of 250 to 500 V/mm at a temperature higher than the Curie temperature (Tc) thereof.

26. The method for fabricating the piezoelectric single crystal device according to claim 23, wherein the primary polarization processing includes applying a DC electric field of 350 to 1500 V/mm in the temperature range of 20° C. to 200° C. in the [101] or [011] direction of the single crystal device or cooling the single crystal device to room temperature while applying a DC electric field of 250 to 500 V/mm at a temperature higher than the Curie temperature (Tc) thereof.

27. The method for fabricating the piezoelectric single crystal device according to claim 6, further comprising auxiliary polarization processing for polarization by applying an electric field in a direction orthogonal to the polarization direction before or after the primary polarization processing.

28. The method for fabricating the piezoelectric single crystal device according to claim 7, further comprising auxiliary polarization processing for polarization by applying an electric field in a direction orthogonal to the polarization direction before or after the primary polarization processing.

29. The method for fabricating the piezoelectric single crystal device according to claim 8, further comprising auxiliary polarization processing for polarization by applying an electric field in a direction orthogonal to the polarization direction before or after the primary polarization processing.

30. The method for fabricating the piezoelectric single crystal device according to claim 9, further comprising auxiliary polarization processing for polarization by applying an electric field in a direction orthogonal to the polarization direction before or after the primary polarization processing.

* * * * *